United States Patent
Park et al.

(10) Patent No.: US 12,321,618 B2
(45) Date of Patent: Jun. 3, 2025

(54) OPERATING METHOD OF STORAGE DEVICE, OPERATING METHOD OF HOST, AND STORAGE SYSTEM INCLUDING THE STORAGE DEVICE AND THE HOST

(71) Applicant: SAMSUNG ELECTRONICS CO., LTD., Suwon-si (KR)

(72) Inventors: Joonmin Park, Seoul (KR); Byoungsul Kim, Suwon-si (KR); Hyunsoo Shim, Uijeongbu-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 187 days.

(21) Appl. No.: 17/948,858

(22) Filed: Sep. 20, 2022

(65) Prior Publication Data

US 2023/0100119 A1    Mar. 30, 2023

(30) Foreign Application Priority Data

Sep. 27, 2021   (KR) .......................... 10-2021-0127539

(51) Int. Cl.
   *G11C 16/30*   (2006.01)
   *G06F 3/06*    (2006.01)

(52) U.S. Cl.
   CPC .......... *G06F 3/0625* (2013.01); *G06F 3/0659* (2013.01); *G06F 3/0679* (2013.01); *G11C 16/30* (2013.01)

(58) Field of Classification Search
   CPC ..................................................... G11C 16/30
   USPC ..................................................... 365/189.09
   See application file for complete search history.

(56) References Cited

U.S. PATENT DOCUMENTS

| | | | |
|---|---|---|---|
| 7,535,307 | B2 | 5/2009 | Lee |
| 7,617,335 | B2 | 11/2009 | Choi et al. |
| 7,639,540 | B2 | 12/2009 | Kim et al. |
| 7,715,268 | B2 | 5/2010 | Hsieh et al. |
| 7,760,574 | B2 | 7/2010 | Chen et al. |
| 10,387,690 | B2 | 8/2019 | Kothamasu et al. |

(Continued)

FOREIGN PATENT DOCUMENTS

| KR | 10-0799038 B1 | 1/2008 |
|---|---|---|
| KR | 10-2018-0038939 A | 4/2018 |
| KR | 10-2021-0040173 A | 4/2021 |

OTHER PUBLICATIONS

Communication dated Feb. 14, 2023 by the European Property Office in counterpart EP Patent Application No. 22195150.2.

(Continued)

*Primary Examiner* — Anthan Tran
(74) *Attorney, Agent, or Firm* — Sughrue Mion, PLLC

(57) ABSTRACT

An operating method of a storage device including a non-volatile memory is provided. The operating method includes: receiving a first source voltage through a first voltage signal pin; based on the first source voltage different from a target voltage of the storage device, controlling the first source voltage to the target voltage; receiving a command, which indicates an information request associated with an operation voltage of the storage device, from a host; transmitting a response, which corresponds to the information request, to the host by using the storage device; receiving a second source voltage which has a voltage level different from the first source voltage, through the first voltage signal pin; and providing the second source voltage to the non-volatile memory.

10 Claims, 17 Drawing Sheets

(56) References Cited

U.S. PATENT DOCUMENTS

| | | | |
|---|---|---|---|
| 10,395,721 | B1 | 8/2019 | Prather et al. |
| 10,438,668 | B2 | 10/2019 | Okamoto |
| 10,453,541 | B1 | 10/2019 | Rowley et al. |
| 2018/0101492 | A1* | 4/2018 | Cho .......................... G06F 1/26 |
| 2020/0333818 | A1* | 10/2020 | Yun .......................... G06F 1/28 |
| 2021/0065772 | A1 | 3/2021 | Suh et al. |

OTHER PUBLICATIONS

Office Action dated Apr. 2, 2025, issued by Korean Intellectual Property Office in Korean Patent Application No. 10-2021-0127539.

* cited by examiner

OPERATING METHOD OF STORAGE DEVICE, OPERATING METHOD OF HOST, AND STORAGE SYSTEM INCLUDING THE STORAGE DEVICE AND THE HOST

CROSS-REFERENCE TO RELATED APPLICATION

This application claims priority to Korean Patent Application No. 10-2021-0127539, filed on Sep. 27, 2021, in the Korean Intellectual Property Office, the disclosure of which is incorporated by reference herein in its entirety.

BACKGROUND

The present disclosure relates to a memory device, and more particularly, to an operating method of a storage device and an operating method of a host.

A storage system may include a host and a storage device. The host is connected to the storage device a standard interface, such as universal flash storage (UFS), serial advanced technology attachment (SATA), small computer small interface (SCSI), serial attached SCSI (SAS), and embedded multimedia card (eMMC).

In a case where a storage system is initially booted, a host finds it difficult to determine a source voltage supported by a storage device connected to the host. In a case where the storage system is initially booted, the storage device may be supplied with a source voltage which differs from a voltage level corresponding to an operation voltage of the storage device. In a case where a source voltage unsupported by the storage device is supplied to the storage device whenever the storage system is booted, a problem may occur in reliability and durability of elements included in the storage device.

SUMMARY

The present disclosure provides an operating method of a storage device, an operating method of a host, and a storage system including the storage device and the host, in which the storage device is supplied with a target voltage of the storage device when initially booted and the supply of a source voltage, which is higher than an operation voltage of the storage device, to the storage device is minimized whenever booted.

According to an aspect of an example embodiment, an operating method of a storage device including a non-volatile memory is provided. The operating method includes: receiving a first source voltage through a first voltage signal pin; based on the first source voltage different from a target voltage of the storage device, controlling the first source voltage to the target voltage; receiving a command, which indicates an information request associated with an operation voltage of the storage device, from a host; transmitting a response, which corresponds to the information request, to the host by using the storage device; receiving a second source voltage which has a voltage level different from the first source voltage, through the first voltage signal pin; and providing the second source voltage to the non-volatile memory.

According to an aspect of an example embodiment, an operation method of a host including a one-time-programmable (OTP) memory and a host register is provided. The operating method includes: providing a first voltage control signal to a power management integrated circuit to control a first source voltage to be provided to a storage device; transmitting a first command, which indicates a characteristic information request of the storage device, to the storage device; receiving a response, which corresponds to the characteristic information request, from the storage device; generating a connection control signal to control a connection between the host register and the OTP memory device based on the response; and providing the power management integrated circuit with one of the first voltage control signal and a second voltage control signal, to control the power management integrated circuit to provide the storage device with a second source voltage having a voltage level different from the first source voltage, based on the connection between the host register and the OTP memory device. The OTP memory device is configured to store source voltage information, and the host register is configured to store a second command for controlling a source voltage output from the power management integrated circuit.

According to an aspect of an example embodiment, a storage system includes: a power management integrated circuit configured to generate a source voltage; a storage device configured to receive a first source voltage from the power management integrated circuit and control the first source voltage to a target voltage of the storage device; and a host configured to receive data associated with an operation voltage of the storage device from the storage device and control the power management integrated circuit to provide the storage device with a second source voltage having a voltage level different from the first source voltage, based on the data.

BRIEF DESCRIPTION OF THE DRAWINGS

The above and other aspects will be more apparent from the following description of example embodiments taken in conjunction with the accompanying drawings, in which.

DETAILED DESCRIPTION

Hereinafter, example embodiments will be described in detail with reference to the accompanying drawings. The Examiner embodiments are provided so that this disclosure will be thorough and complete, and will fully convey the concept of the inventive concept to one of ordinary skill in the art. The inventive concept may be variously modified. The specifically described example embodiments not limit the inventive concept and it should be understood that the inventive concept covers all the modifications, equivalents, and replacements within the idea and technical scope of the inventive concept.

Figure 1:
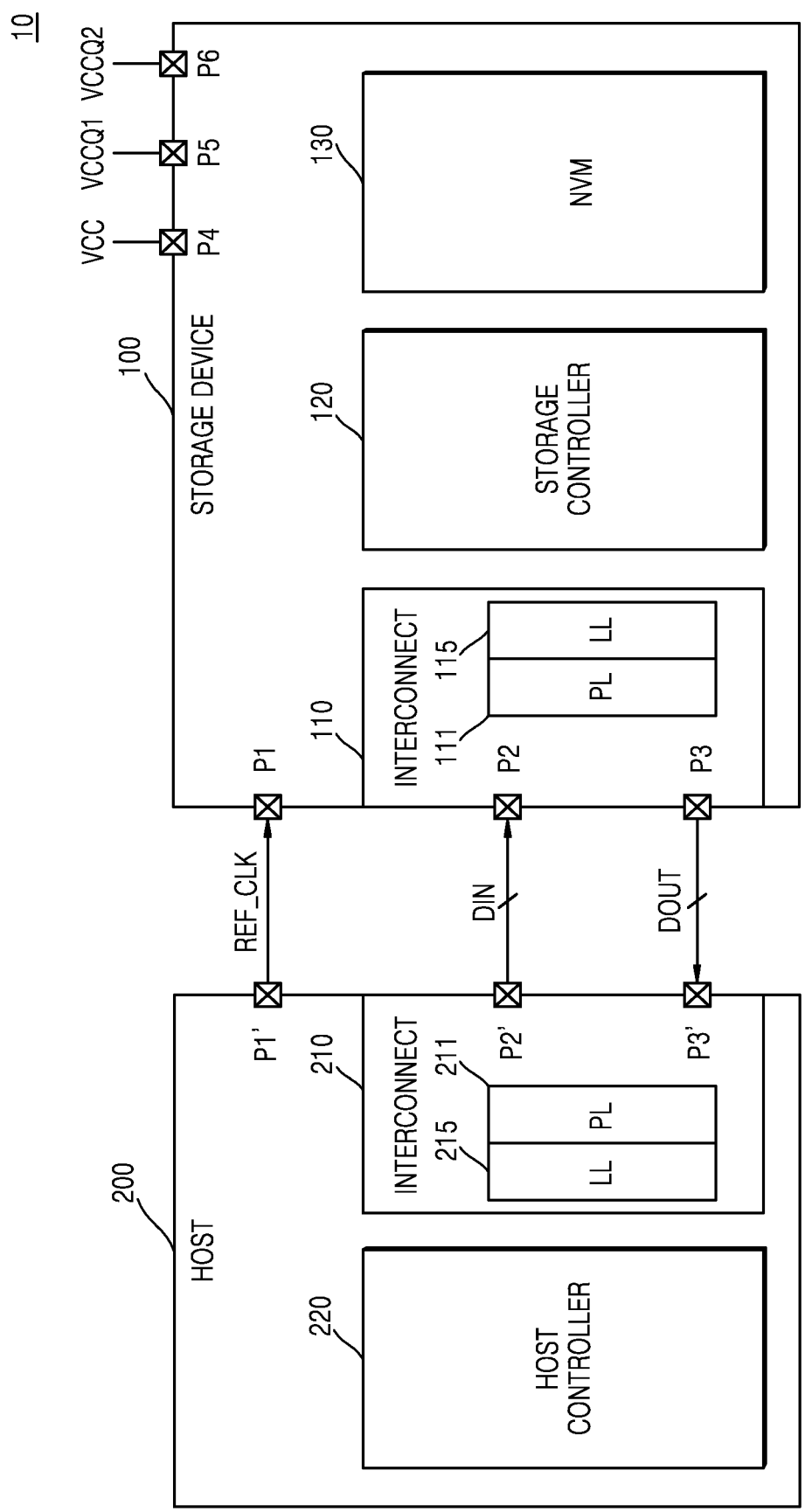
FIG. 1 is a block diagram illustrating a storage system according to an example embodiment.

FIG. 1 is a block diagram illustrating a storage system 10 according to an example embodiment.

Referring to FIG. 1, the storage system 10 may include a storage device 100 and a host 200. For example, the storage device 100 may be connected to the host 200 according to an interface protocol defined by the universal flash storage (UFS) standard, and thus, the storage device 100 may include a UFS device and the host 200 may include a UFS host. However, example embodiments are not limited thereto, and the storage device 100 may be connected to the host 200 according to various standard interfaces.

The host 200 may include an interconnect 210 and a host controller 220. The host 200 may control a data processing operation on the storage device 100, and for example, may control a data read operation or a data write operation. The host 200 may denote a data processing device for processing data like a central processing unit (CPU), a processor, a microprocessor, or an application processor (AP). The host 200 may execute an operating system (OS) and/or various application programs. In an example embodiment, the storage system 10 may be included in a mobile device, and the host 200 may be implemented with an AP. In an example embodiment, the host 200 may be implemented with a system-on-a-chip (SoC), and thus, may be embedded into an electronic device.

The host 200 may include a reference clock generator which generates a reference clock signal REF_CLK. The reference clock generator may provide the reference clock signal REF_CLK to the storage device 100 and may generate an internal clock signal used to transmit data on the basis of the reference clock signal REF_CLK.

The host 200 may further include a one-time-programmable (OTP) memory device. The OTP memory device may denote a memory device where data is written through a one-time program operation and a read operation is allowed a plurality of times. The host 200 may control a connection of the OTP memory device on the basis of a response corresponding to an information request associated with an operation voltage received from the storage device 100. Also, the host 200 may control a voltage level of a source voltage VCC provided to the storage device 100 on the basis of a connection of the OTP memory device. An operating method of the host 200 including the OTP memory device is described below in detail with reference to FIG. 7.

The storage device 100 may include an interconnect 110, a storage controller 120, and a non-volatile memory 130.

The storage controller 120 may control the non-volatile memory 130 to write data in the non-volatile memory 130 in response to a write request from the host 200, or may control the non-volatile memory 130 to read the data stored in the non-volatile memory 130 in response to a read request from the host 200.

The non-volatile memory 130 may include a plurality of memory cells, and for example, the plurality of memory cells may include flash memory cells. In an example embodiment, the plurality of memory cells may include NAND flash memory cells. However, example embodiments are not limited thereto, and in another example embodiment, the plurality of memory cells may be resistive memory cells such as resistive random access memory (RAM) (ReRAM) memory cells, phase change RAM (PRAM) memory cells, or magnetic RAM (MRAM) memory cells.

Furthermore, in FIG. 1, it is illustrated that the interconnect 110 and the storage controller 120 are separate elements, but example embodiments are not limited thereto and the storage controller 120 may be an element which includes the interconnect 110. This may as also apply to the other drawings described below, in addition to FIG. 1. For example, when the storage controller 120 is implemented as one package chip, the interconnect 110 may be implemented in the package chip together therewith.

The host 200 may include a first pin P1' and may transmit the reference clock signal REF_CLK to the storage device 100 through the first pin P1'. The storage device 100 may further include a first pin P1 which is configured to be connected to the first pin P1' and may receive the reference clock signal REF_CLK from the host 200 through the first pin P1.

The host 200 may include second and third pins P2' and P3', and the storage device 100 may include second and third pins P2 and P3 which are configured to be respectively connected to the second and third pins P2' and P3'. The host 200 may transmit an input signal DIN to the storage device 100 through the second pins P2' and P2, and thus, the second pins P2' and P2 may be referred to as "input signal pins". The host 200 may transmit a command to the storage device 100 through the second pins P2' and P2. The host 200 may transmit a command, which includes an information request associated with an operation voltage of the storage device 100, to the storage device 100 through the second pins P2' and P2. Information associated with the operation voltage of the storage device 100 may include a type and an operation voltage level of the storage device 100. In some example embodiments, the input signal may be a differential input signal, and thus, the host 200 may include two second pins P2' and the storage device 100 may include two second pins P2.

The storage device 100 may transmit an output signal DOUT to the host 200 through the third pins P3' and P3, and thus, the third pins P3' and P3 may be referred to as "output signal pins". The storage device 100 may transmit a response, which corresponds to a command of the host 200, to the host 200 through the third pins P3' and P3. The storage device 100 may transmit a response, which corresponds to the information request associated with the operation voltage of the storage device 100, to the host 200 through the third pins P3' and P3. In some example embodiments, the output signal may be a differential output signal, and thus, the host 200 may include two third pins P3' and the storage device 100 may include two third pins P3.

The storage device 100 may include fourth pins P4 to P6. The fourth pins P4 to P6 may be connected to a voltage generator which provides a voltage to the storage device 100. According to example embodiments, the voltage generator may be a power management integrated circuit (PMIC). The PMIC may include a plurality of fifth pins respectively corresponding to the fourth pins P4 to P6 and may provide a voltage to the storage device 100 through the fourth pins P4 to P6 respectively connected to the fifth pins.

The storage device 100 may receive a voltage through the fourth pins P4 to P6, and thus, the fourth pins P4 to P6 may be referred to as "voltage signal pins". Hereinafter, the fourth pins P4 to P6 may be respectively referred to as a first voltage signal pin P4, a second voltage signal pin P5, and a third voltage signal pin P6. VCC, VCCQ1, and VCCQ2 may be input as a source voltage to the storage device 100. The VCC may be a main source voltage for the storage device 100 and may have a value of, for example, 2.4 V to 3.6 V. The VCCQ1 may be a source voltage for supplying a voltage having a low range and may have a value of, for example, 1.14 V to 1.26 V. According to example embodiments, the VCCQ1 may be referred to as VCCQ. The VCCQ2 may be a source voltage for supplying a voltage having a range which is lower than the VCC and higher than the VCCQ1 and may have a value of, for example, 1.7 V to 1.95 V. The VCCQ1 and the VCCQ2 may be provided to the storage device 100. For example, the VCCQ1 and the VCCQ2 may be provided to the storage controller 120.

The VCC may be provided to the storage device 100 through the first voltage signal pin P4, the VCCQ1 may be provided to the storage device 100 through the second voltage signal pin P5, and the VCCQ2 may be provided to the storage device 100 through the third voltage signal pin P6. According to example embodiments, at least one of the second voltage signal pin P5 and the third voltage signal pin P6 may be omitted. At least one of the VCC, the VCCQ1, and the VCCQ2 may be provided to the non-volatile memory 130 through the voltage controller included in the storage device 100. For example, the VCC may be provided to the non-volatile memory 130. The voltage controller is described below in detail with reference to FIG. 2.

The interconnects 110 and 210 may provide an interface for exchanging data between the host 200 and the storage device 100. In an example embodiment, the interconnect 110 may include a physical layer (PL) 111 and a link layer (LL) 115, and the physical layer 111 may be connected to the second and third pins P2 and P3.

Likewise, the interconnect 210 may also include a physical layer 211 and a link layer 215, and the physical layer 211 may be connected to the second and third pins P2' and P3'. Each of the physical layers 111 and 211 may include physical elements for exchanging data between the host 200 and the storage device 100, and for example, may include at least one transmitter and at least one receiver. Each of the link layers 115 and 215 may manage the transmission and composition of data, and moreover, may manage an error and integrity of the data.

A transmitter included in the interconnect 210 of the host 200 and a receiver included in the interconnect 110 of the storage device 100 may configure one lane. A plurality of lanes may be provided between the interconnect 210 of the host 200 and the interconnect 110 of the storage device 100. Each of the plurality of lanes may be a transmission channel for carrying a unidirectional signal, a single signal, or information.

In an example embodiment, when the storage system 10 is a mobile device, the link layers 115 and 215 may be defined by a "UniPro" spec, and the physical layers 111 and 211 may defined by an "M-PHY" spec. UniPro and M-PHY may each be an interface protocol proposed by the mobile industry processor interface (MIPI) alliance. In this case, the link layers 115 and 215 may each include a physical adapted layer. The physical adapted layer may control the physical layers 111 and 211, which manage a symbol of data or manage power.

In some example embodiments, the storage device 100 may be implemented as a DRAMless device, and the DRAMless device may denote a device which does not include a DRAM cache. In this case, the storage controller 120 may not include a DRAM controller. For example, the storage device 100 may use a partial region of the non-volatile memory 130 as a buffer memory.

In some example embodiments, the storage device 100 may be an internal memory embedded into an electronic device. For example, the storage device 100 may be an embedded UFS memory device, an embedded multimedia card (eMMC), or a solid state drive (SSD). However, example embodiments are not limited thereto, and the storage device 100 may be a non-volatile memory (for example, OTP read-only memory (ROM) (OTPROM), programmable ROM (PROM), erasable and programmable ROM (EPROM), electrically erasable and programmable ROM (EEPROM), mask ROM, and flash ROM. In some example embodiments, the storage device 100 may be an external memory, which is detachably attached to an electronic device. For example, the storage device 100 may include at least one of a UFS memory card, a compact flash (CF) memory card, a secure digital (SD) memory card, a micro secure digital (micro-SD) memory card, a mini secure digital (mini-SD) memory card, an extreme digital (xD) memory card, and a memory stick.

The storage system 10 may be implemented with, for example, an electronic device such as a personal computer (PC), a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device or portable navigation device (PND), an MP3 player, a handheld game console, or an e-book. Also, the storage system 10 may be implemented with, for example, various types of electronic devices such as wearable devices such as wrist watches and head-mounted displays (HMDs).

Figure 2:
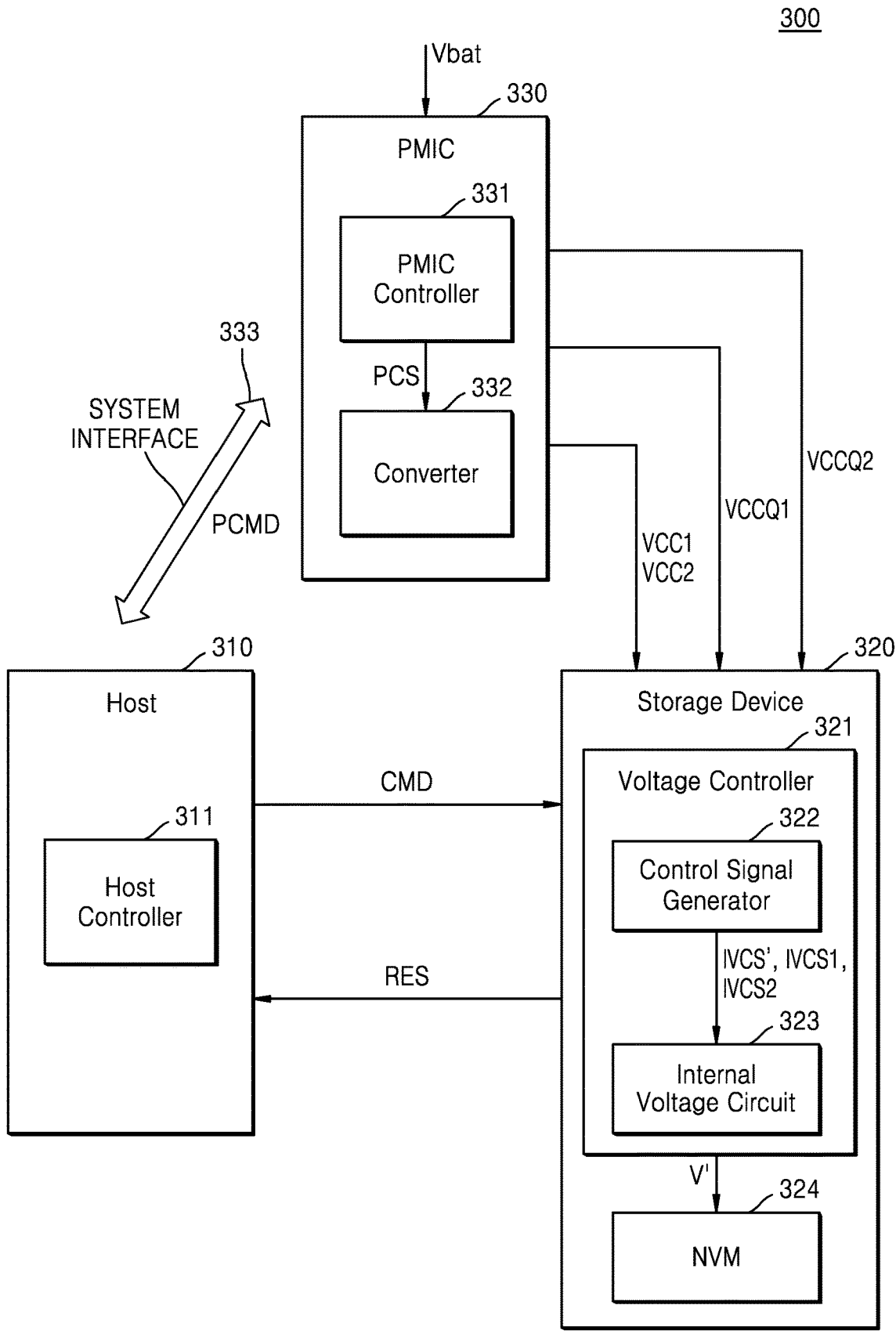
FIG. 2 is a block diagram illustrating a storage system including a power management integrated circuit, according to an example embodiment.

FIG. 2 is a block diagram illustrating a storage system 300 including a PMIC, according to an example embodiment.

Referring to FIG. 2, the storage system 300 may include a host 310, a storage device 320, and a PMIC 330. The storage system 300, the host 310, and the storage device 320 of FIG. 2 may respectively correspond to the storage system 10, the host 200, and the storage device 100 of FIG. 1, and thus, repeated descriptions thereof are omitted.

The PMIC 330 may include a PMIC controller 331 and a converter 332. The PMIC controller 331 may control an overall operation of the PMIC 330. The PMIC controller 331 may provide the converter 332 with a PMIC control signal PCS, which controls voltages generated by the converter 332. The PMIC 330 may be connected to and driven by external power, and for example, may be connected to and driven by battery power VBAT. The PMIC 330 and the host 310 may be configured as one package, but are not limited thereto and the PMIC 330 and the storage device 320 may be configured as one package.

The converter 332 may receive the battery power VBAT to generate source voltages VCC, VCCQ1, and VCCQ2 having various voltage levels. According to example embodiments, the converter 332 may be configured with buck regulators which generate the source voltages VCC1, VCC2, VCCQ1, and VCCQ2, which are lower than a voltage level of the battery power VBAT, on the basis of the battery power VBAT.

The system interface 333 may be connected between the PMIC 330 and the host 310, and may a command, data, and control information may be exchanged through the system interface 333. The host 310 may provide the PMIC command PCMD to the PMIC 330 through the system interface 333. The PMIC command PCMD may denote a command for controlling voltage levels of the source voltages VCC1, VCC2, VCCQ1, and VCCQ2 provided to the storage device 320 by the PMIC 330.

The PMIC controller 331 may decode a PMIC command PCMD provided through the system interface 333 by the host 310 to provide the converter 332 with the PMIC control signal PCS on the basis of information about a voltage level included in the command. The converter 332 may step down or up the battery power VBAT on the basis of the PMIC control signal PCS to generate the source voltages VCC1, VCC2, VCCQ1, and VCCQ2. Also, according to example embodiments, the converter 332 may convert a voltage level of the source voltage VCC on the basis of the PMIC control signal PCS.

The storage device 320 may include a voltage controller 321 and a non-volatile memory 324. The voltage controller 321 may include a control signal generator 322 and an internal voltage circuit 323. The control signal generator 322 may generate internal voltage control signals IVCS', IVCS1, and IVCS2 indicating whether to convert the source voltages VCC1 and VCC2, on the basis of the source voltages VCC1 and VCC2. The internal voltage circuit 323 may convert the source voltages VCC1 and VCC2 on the basis of the internal voltage control signals IVCS', IVCS1, and IVCS2. An operation of the voltage controller 321 is described below in detail with reference to FIG. 3. In an example embodiment, the voltage controller 321 may be disposed outside the storage controller 120. However, example embodiments are not limited thereto, and in some example embodiments, the voltage controller 321 may be implemented in the storage controller 120.

The storage device 320 may receive a first source voltage VCC1 through a first voltage signal pin (for example, P4 of FIG. 1). The storage device 320 may receive the first source voltage VCC1 from the PMIC 330. The first source voltage VCC1 may be a main source voltage of the storage device 320 and may denote a source voltage which is initially provided to the storage device 320 when the storage system 300 is booted. The first source voltage VCC1 may be within a range of 2.7 V to 3.6 V. In an example embodiment, the first source voltage VCC1 may have a voltage level which is higher than an operation voltage of the storage device 320. For example, the operation voltage of the storage device 320 may be about 2.5 V, and the first source voltage VCC1, initially provided to the storage device 320 when booted, may be about 3 V.

When the first source voltage VCC1 differs from a target (i.e., reliable) voltage of the storage device 320, the storage device 320 may convert the first source voltage VCC1 into a voltage level corresponding to the target voltage of storage device 320. The target voltage may be a voltage which ensures the reliability of the storage device 320 and may denote a voltage for maintaining the durability of the elements included in the storage device 320 for a long time. The target voltage may be a voltage which is higher than or equal to the operation voltage of the storage device 320. For example, the operation voltage of the storage device 320 may be about 2.5 V, and the target voltage may be within a range of 2.5 V to 2.7 V.

The control signal generator 322 may generate the initial internal voltage control signal IVCS' indicating whether to convert the first source voltage VCC1, on the basis of the first source voltage VCC1. The control signal generator 322 may generate the internal voltage control signal IVCS' on the basis of comparing the first source voltage VCC1 with the target voltage. When the first source voltage VCC1 is higher than the target voltage, the control signal generator 322 may generate the initial internal voltage control signal IVCS' for converting the first source voltage VCC1. For example, when a voltage level of the first source voltage VCC1 is about 3 V and a voltage level of the target voltage is about 2.6 V, the control signal generator 322 may generate the initial internal voltage control signal IVCS' for converting the first source voltage VCC1.

The internal voltage circuit 323 may convert a voltage level of the first source voltage VCC1 into a voltage level corresponding to the target voltage on the basis of the initial internal voltage control signal IVCS'. For example, when a voltage level of the first source voltage VCC1 is about 2.7 V and a voltage level of the target voltage is about 2.6 V, the internal voltage circuit 323 may convert a voltage level of the first source voltage VCC1 into about 2.6 V on the basis of the initial internal voltage control signal IVCS'.

The internal voltage circuit 323 may convert the first source voltage VCC1 into a voltage level corresponding to the target voltage of the storage device 320 and may provide the first source voltage VCC1 as a memory voltage V' to the non-volatile memory 324. For example, the internal voltage circuit 323 may convert a voltage level of the first source voltage VCC1 into about 2.6 V and may provide the first source voltage VCC1 as the memory voltage V' to the non-volatile memory 324. Even when the first source voltage VCC1, which is higher than the target voltage, is provided to the storage device 320, the internal voltage circuit 323 may convert the first source voltage VCC1 into a voltage level corresponding to the target voltage, and thus, the voltage level corresponding to the target voltage may be provided to the non-volatile memory 324. Therefore, reliability of the non-volatile memory 324 may be increased.

The storage device 320 may receive a command CMD, which includes an information request associated with the operation voltage of the storage device 320, from the host 310. The storage device 320 may transmit a response RES, which corresponds to the information request associated with the operation voltage, to the host 310. For example, the storage device 320 may receive the command CMD, which includes a version information request of UFS, from the host 310 and may transmit a response RES, which corresponds to a UFS version (i.e., UFS 3.0 version), to the host 310.

The host 310 may generate the PMIC command PCMD on the basis of the response RES received from the storage device 320. In detail, the host controller 311 may generate the PMIC command PCMD, which controls the PMIC 330, to convert a voltage level of the first source voltage VCC1, on the basis of the response RES. The host controller 311 may generate the PMIC command PCMD, which controls the PMIC 330, to generate the second source voltage VCC2 having a voltage level different from that of the first source voltage VCC1, on the basis of the response RES. A voltage level of the second source voltage VCC2 may be the same as the operation voltage of the storage device 320. For example, assuming that a voltage level of the first source voltage VCC1 is about 3 V and the operation voltage of the storage device 320 is about 2.5 V, the host controller 311 may generate the PMIC command PCMD, which controls the PMIC 330, to generate the second source voltage VCC2 corresponding to a voltage level of about 2.5 V.

The PMIC 330 may generate the second source voltage VCC2 instead of the first source voltage VCC1, on the basis of the PMIC command PCMD. For example, the PMIC 330 may convert the first source voltage VCC1, which has a voltage level of about 3 V, into the second source voltage VCC2 having a voltage level of about 2.5 V, on the basis of the PMIC command PCMD. The PMIC 330 may provide the second source voltage VCC2 to the storage device 320 through a first voltage signal pin (for example, P4 of FIG. 1).

The control signal generator 322 may generate the internal voltage control signals IVCS1 and IVCS2 indicating whether to convert the second source voltage VCC2, on the basis of the second source voltage VCC2. The control signal generator 322 may generate the internal voltage control signals IVCS1 and IVCS2 on the basis of comparing the second source voltage VCC2 with the target voltage.

When the second source voltage VCC2 is lower than or equal to the target voltage, the control signal generator 322 may generate the first internal voltage control signal IVCS1 for maintaining the second source voltage VCC2. For example, assuming that a voltage level of the second source voltage VCC2 is about 2.5 V and a voltage level of the target voltage is about 2.6 V, the control signal generator 322 may generate the first internal voltage control signal IVCS1. As another example, assuming that a voltage level of the second source voltage VCC2 is about 2.6 V and a voltage level of the target voltage is about 2.6 V, the control signal generator 322 may generate the first internal voltage control signal IVCS1. The control signal generator 322 may provide the first internal voltage control signal IVCS1 to the internal voltage circuit 323.

When the second source voltage VCC2 is higher than a voltage level of the target voltage, the control signal generator 322 may generate the second internal voltage control signal IVCS2 for converting the second source voltage VCC2. For example, assuming that a voltage level of the second source voltage VCC2 is about 2.7 V and a voltage level of the target voltage is about 2.6 V, the control signal generator 322 may generate the second internal voltage control signal IVCS2. As another example, assuming that a voltage level of the second source voltage VCC2 is about 3 V and a voltage level of the target voltage is about 2.6 V, the control signal generator 322 may generate the second internal voltage control signal IVCS2. The control signal generator 322 may provide the second internal voltage control signal IVCS2 to the internal voltage circuit 323.

The internal voltage circuit 323 may operate based on the first internal voltage control signal IVCS1 and the second internal voltage control signal IVCS2. The internal voltage circuit 323 may be deactivated based on the first internal voltage control signal IVCS1. For example, when the first internal voltage control signal IVCS1 is enabled, the internal voltage circuit 323 may be deactivated, and thus, the voltage controller 321 may provide the second source voltage VCC2 as the memory voltage V' to the non-volatile memory 324 without undergoing the internal voltage circuit 323. In other words, when the second source voltage VCC2 provided to the storage device 320 is lower than or equal to the target voltage, the second source voltage VCC2 may not be converted by the storage device 320 and may be provided to the non-volatile memory 324 as-is.

The internal voltage circuit 323 may convert the second source voltage VCC2 on the basis of the second internal voltage control signal IVCS2. When the internal voltage circuit 323 receives the second internal voltage control signal IVCS2, the internal voltage circuit 323 may convert the second source voltage VCC2 into a voltage level corresponding to the target voltage. For example, assuming that the second source voltage VCC2 is about 2.7 V and the target voltage is about 2.6 V, the internal voltage circuit 323 may convert a voltage level of the second source voltage VCC2 into about 2.6 V on the basis of the second internal voltage control signal IVCS2. When the second source voltage VCC2 provided to the storage device 320 is higher than the target voltage, the second source voltage VCC2 may be converted by the storage device 320, and a converted second source voltage VCC2 may be provided to the non-volatile memory 324.

In an example embodiment, the first internal voltage control signal IVCS1 and the second internal voltage control signal IVCS2 may have different logic levels. For example, when the first internal voltage control signal IVCS1 has a logic low level, the second internal voltage control signal IVCS2 may have a logic high level. When the internal voltage circuit 323 receives an internal voltage control signal having a logic low level (i.e., the first internal voltage control signal IVCS1), an operation of the internal voltage circuit 323 may stop, and when the internal voltage circuit 323 receives an internal voltage control signal having a logic high level (i.e., the second internal voltage control signal IVCS2), an operation of the internal voltage circuit 323 the second source voltage VCC2 may be changed. The initial internal voltage control signal IVCS', the first internal voltage control signal IVCS1, and the second internal voltage control signal IVCS2 may have a difference in logic level and timing at which the storage device 320 receives the signals.

Figure 3:
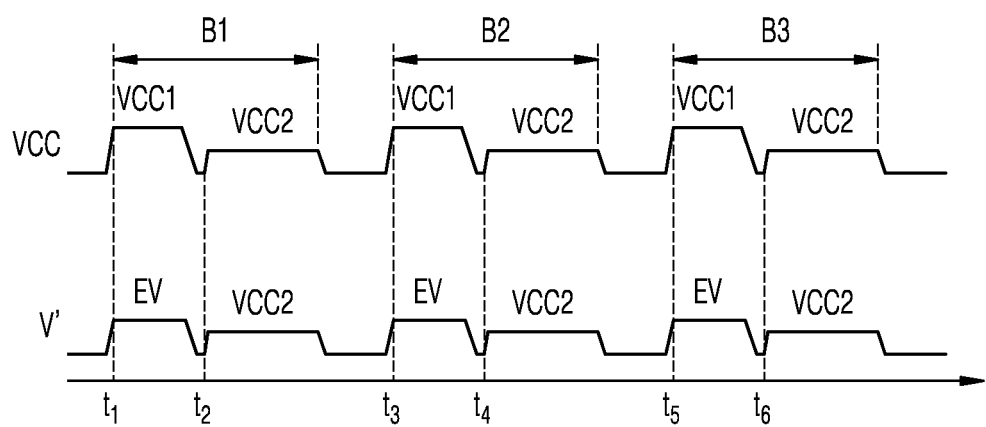
FIG. 3 is a diagram for describing a source voltage according to an example embodiment.

FIG. 3 is a diagram for describing a source voltage according to an example embodiment. In detail, FIG. 3 shows a source voltage VCC and a memory voltage V' with respect to time. Hereinafter, FIGS. 3 and 2 will be referred to together.

At a first time t1 of a first booting period B1, the storage device 320 may receive a first source voltage VCC1 from the PMIC 330. When the first source voltage VCC1 is higher than a target voltage EV, the control signal generator 322 may generate an initial internal voltage control signal IVCS'. The internal voltage circuit 323 may convert the first source voltage VCC1 into a voltage level corresponding to the target voltage EV. The internal voltage circuit 323 may provide the non-volatile memory 324 with the first source voltage VCC1, which has a voltage level corresponding to the target voltage EV, as a memory voltage V'.

At a second time t2 of the first booting period B1, the host controller 311 may generate a PMIC command PCMD on the basis of a response of the storage device 320. The PMIC 330 may generate the second source voltage VCC2 instead of the first source voltage VCC1, on the basis of the PMIC command PCMD. When the second source voltage VCC2 is lower than or equal to the target voltage, the control signal generator 322 may generate a first internal voltage control signal IVCS1 for maintaining the second source voltage VCC2. The internal voltage circuit 323 may provide the non-volatile memory 324 with the second source voltage VCC2 as the memory voltage V'.

An operation of the storage system 300 during the first booting period B1 may be identically performed in a second booting period B2 and a third booting period B3 subsequent to the first booting period B1. In FIG. 3, the first to third booting periods B1 to B3 are shown, but in a booting period subsequent to the third booting period B3, an operation of the storage system 300 may be performed identically to the first booting period B1.

Figure 4:
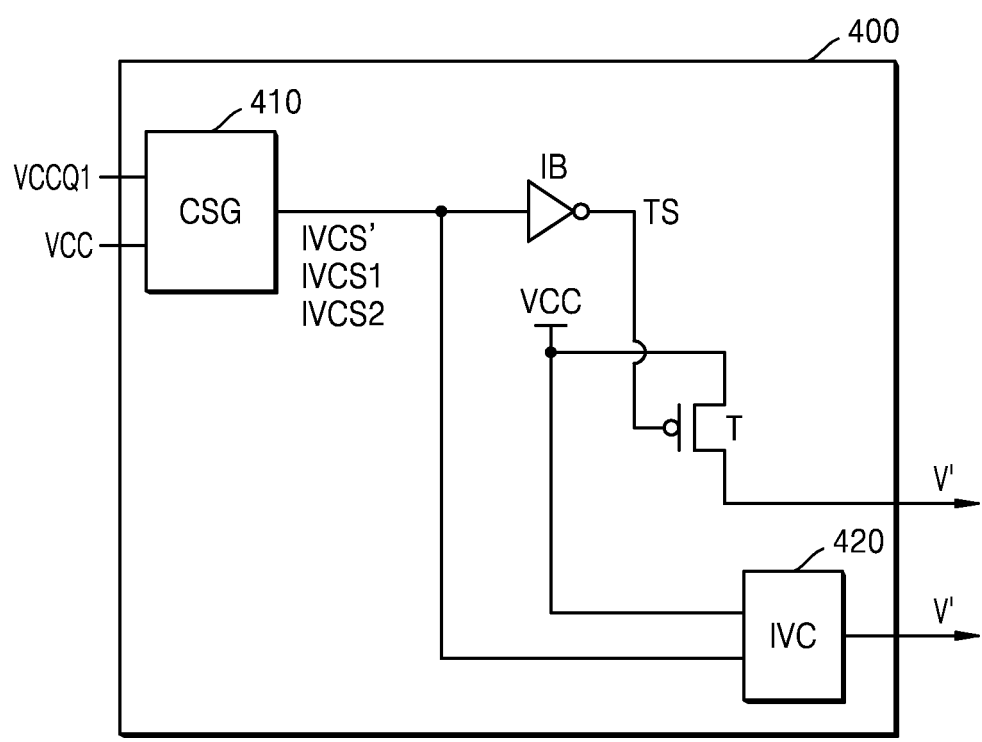
FIG. 4 is a diagram illustrating a voltage controller according to an example embodiment.

FIG. 4 is a diagram illustrating a voltage controller 400 according to an example embodiment.

Referring to FIG. 4, the voltage controller 400 may include a control signal generator 410, an internal voltage circuit 420, an inverter IB, and a switching element T. The voltage controller 400, the control signal generator 410, and the internal voltage circuit 420 of FIG. 4 may respectively correspond to the voltage controller 321, the control signal generator 322, and the internal voltage circuit 323 of FIG. 2, and thus, repeated descriptions thereof are omitted.

The control signal generator 410 may receive one of a first source voltage and a second source voltage as a source voltage VCC. For example, the control signal generator 410 may receive the source voltage VCC through a first voltage signal pin (for example, P4 of FIG. 1) and may receive a third source voltage VCCQ1 through a second voltage signal pin (for example, P5 of FIG. 1). A voltage level of the third source voltage VCCQ1 may not be changed. The control signal generator 410 may be configured to compare the source voltage VCC with a target voltage. The control signal generator 410 may be configured to compare a voltage level of the source voltage VCC with a voltage level of the target voltage.

The control signal generator 410 may generate internal voltage control signals IVCS', IVCS1, and IVCS2 indicating whether to convert the source voltage VCC, on the basis of the source voltage VCC. In an example embodiment, the control signal generator 410 may generate the internal voltage control signals IVCS', IVCS1, and IVCS2 on the basis of the source voltage VCC and the third source voltage VCCQ1. For example, the control signal generator 410 may voltage-divide the source voltage VCC and may compare a voltage-divided source voltage VCC with the third source voltage VCCQ1 to generate the internal voltage control signals IVCS1 and IVCS2. When a voltage-divided first source voltage VCC is higher than the third source voltage VCCQ1, the control signal generator 410 may generate an initial internal voltage control signal IVCS'.

When a voltage-divided second source voltage VCC is lower than or equal to the third source voltage VCCQ1, the control signal generator 410 may generate a first internal voltage control signal IVCS1. When the voltage-divided second source voltage VCC is higher than the third source voltage VCCQ1, the control signal generator 410 may generate a second internal voltage control signal IVCS2. For example, assuming that a second source voltage is about 2.5 V, the voltage-divided second source voltage VCC is about 1.15 V, and the third source voltage VCCQ1 is about 1.2 V, in a case where the control signal generator 410 receives the second source voltage as the source voltage VCC, the control signal generator 410 may generate the first internal voltage control signal IVCS1 because 1.15 V is lower than 1.2 V. Assuming that the second source voltage is about 2.7 V, the voltage-divided second source voltage VCC is about 1.296 V, and the third source voltage VCCQ1 is about 1.2 V, the control signal generator 410 may generate the second internal voltage control signal IVCS2 because 1.296 V is higher than 1.2 V.

In an example embodiment, the control signal generator 410 may generate a reference voltage on the basis of the third source voltage VCCQ1 and may generate the internal voltage control signals IVCS', IVCS1, and IVCS2 on the basis of the reference voltage and the source voltage VCC. For example, the control signal generator 410 may generate the reference voltage on the basis of the third source voltage VCCQ1 and may compare the source voltage VCC with the reference voltage to generate the internal voltage control signals IVCS1 and IVCS2.

When the first source voltage VCC is higher than the reference voltage, the control signal generator 410 may generate the initial internal voltage control signal IVCS'. When the second source voltage VCC is lower than or equal to the reference voltage, the control signal generator 410 may generate the first internal voltage control signal IVCS1. When the second source voltage VCC is higher than the reference voltage, the control signal generator 410 may generate the second internal voltage control signal IVCS2. However, example embodiments are not limited thereto.

The internal voltage control signals IVCS', IVCS1, and IVCS2 may be provided to the inverter IB and the internal voltage circuit 420. The inverter IB may output a logic level opposite to a logic level of each of the internal voltage control signals IVCS', IVCS1, and IVCS2.

The internal voltage circuit 420 may convert the source voltage VCC on the basis of the internal voltage control signals IVCS', IVCS1, and IVCS2. When the first source voltage is different from the target voltage and is provided as the source voltage VCC to the internal voltage circuit 420 and the control signal generator 410, the internal voltage circuit 420 may convert a voltage level of the first source voltage into a voltage level corresponding to the target voltage on the basis of the initial internal voltage control signal IVCS'.

When the second source voltage is equal to or lower than the target voltage and is provided as the source voltage VCC to the internal voltage circuit 420 and the control signal generator 410, the internal voltage circuit 420 may stop an operation thereof on the basis of the first internal voltage control signal IVCS1 and may not output the memory voltage V'.

When the second source voltage exceeds the target voltage and is provided as the source voltage VCC to the internal voltage circuit 420 and the control signal generator 410, the internal voltage circuit 420 may convert a voltage level of the second source voltage into a voltage level corresponding to the target voltage on the basis of the second internal voltage control signal IVCS2.

The switching element T may switch the source voltage VCC on the basis of the internal voltage control signals IVCS', IVCS1, and IVCS2. When the internal voltage circuit 420 receives a switching control signal TS corresponding to the initial internal voltage control signal IVCS', the switching element T may be turned off. When the internal voltage circuit 420 receives the switching control signal TS corresponding to the first internal voltage control signal IVCS1, the switching element T may be turned on. When the internal voltage circuit 420 receives the switching control signal TS corresponding to the second internal voltage control signal IVCS2, the switching element T may be turned off. The switching control signal TS corresponding to the internal voltage control signals IVCS', IVCS1, and IVCS2 may denote a signal obtained by converting each of the internal voltage control signals IVCS', IVCS1, and IVCS2 by using the inverter IB.

When the switching element T is turned on, the source voltage VCC may be output to the outside of the voltage controller 400 through the switching element T. The source voltage VCC may be transferred as the memory voltage V' to a non-volatile memory. A source voltage, output from one of the switching element T and the internal voltage circuit 420 on the basis of the internal voltage control signals IVCS', IVCS1, and IVCS2, may be transferred as the memory voltage V' to the non-volatile memory.

Figure 5:
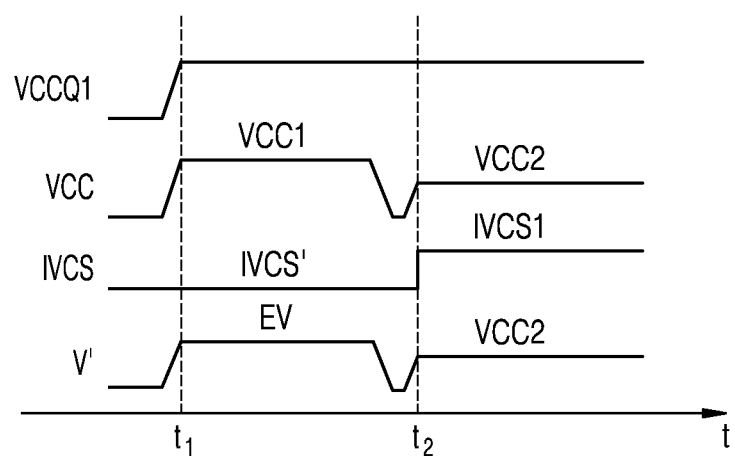
FIG. 5 is a diagram for describing internal signals of a voltage controller according to an example embodiment.

FIG. 5 is a diagram for describing internal signals of a voltage controller according to an example embodiment. Hereinafter, FIGS. 5 and 4 will be referred to together.

A case may be assumed where a first source voltage VCC1 has a voltage level which is higher than a target voltage of a storage device, a second source voltage VCC2 has a voltage level which is the same as an operation voltage of the storage device, and the target voltage is higher than the operation voltage. At a first time t1, a third source voltage VCCQ1 and the first source voltage VCC1 may be provided to the control signal generator 410. The first source voltage VCC1 may be provided to the internal voltage circuit 420 and the second switching element T2. Because the first source voltage VCC1 is higher than a target voltage EV, the control signal generator 410 may generate an initial internal voltage control signal IVCS'. The initial internal voltage control signal IVCS' may have a logic low level. The initial internal voltage control signal IVCS' may be transferred to the internal voltage circuit 420, and the internal voltage circuit 420 may convert a logic level of the first source voltage VCC1 into a voltage level corresponding to the target voltage EV. The internal voltage circuit 420 may output a memory voltage V' having a voltage level corresponding to the target voltage EV. A switching control signal TS corresponding to the initial internal voltage control signal IVCS' may have a logic high level, and the switching element T may be turned off.

At a second time t2, a second source voltage VCC2 may be provided as the source voltage VCC to the control signal generator 410. The second time t2 may denote a time at which a host (for example, the host 310 of FIG. 2) generates a PMIC command for generating the second source voltage VCC2 on the basis of a response of a storage device (for example, the storage device 320 of FIG. 2) and a PMIC (for example, the PMIC 330 of FIG. 2) provides the second source voltage VCC2 as the source voltage VCC to the storage device on the basis of the PMIC command. The second source voltage VCC2 may be provided to the internal voltage circuit 420 and the second switching element T2. The second source voltage VCC2 may be lower than the target voltage EV, and thus, the control signal generator 410 may generate a first internal voltage control signal IVCS1. The first internal voltage control signal IVCS1 may have a logic high level. The first internal voltage control signal IVCS1 may be transferred to the internal voltage circuit 420, and the internal voltage circuit 420 may stop operation. The internal voltage circuit 420 may not output the memory voltage V'. A switching control signal TS corresponding to the first internal voltage control signal IVCS1 may have a logic low level, and the switching element T may be turned on. The second source voltage VCC2 may be output through the switching element T, and the switching element T may output the second source voltage VCC2 as the memory voltage V'. The memory voltage V' may be selectively provided from one of the switching element T and the internal voltage circuit IVC.

Figure 6:
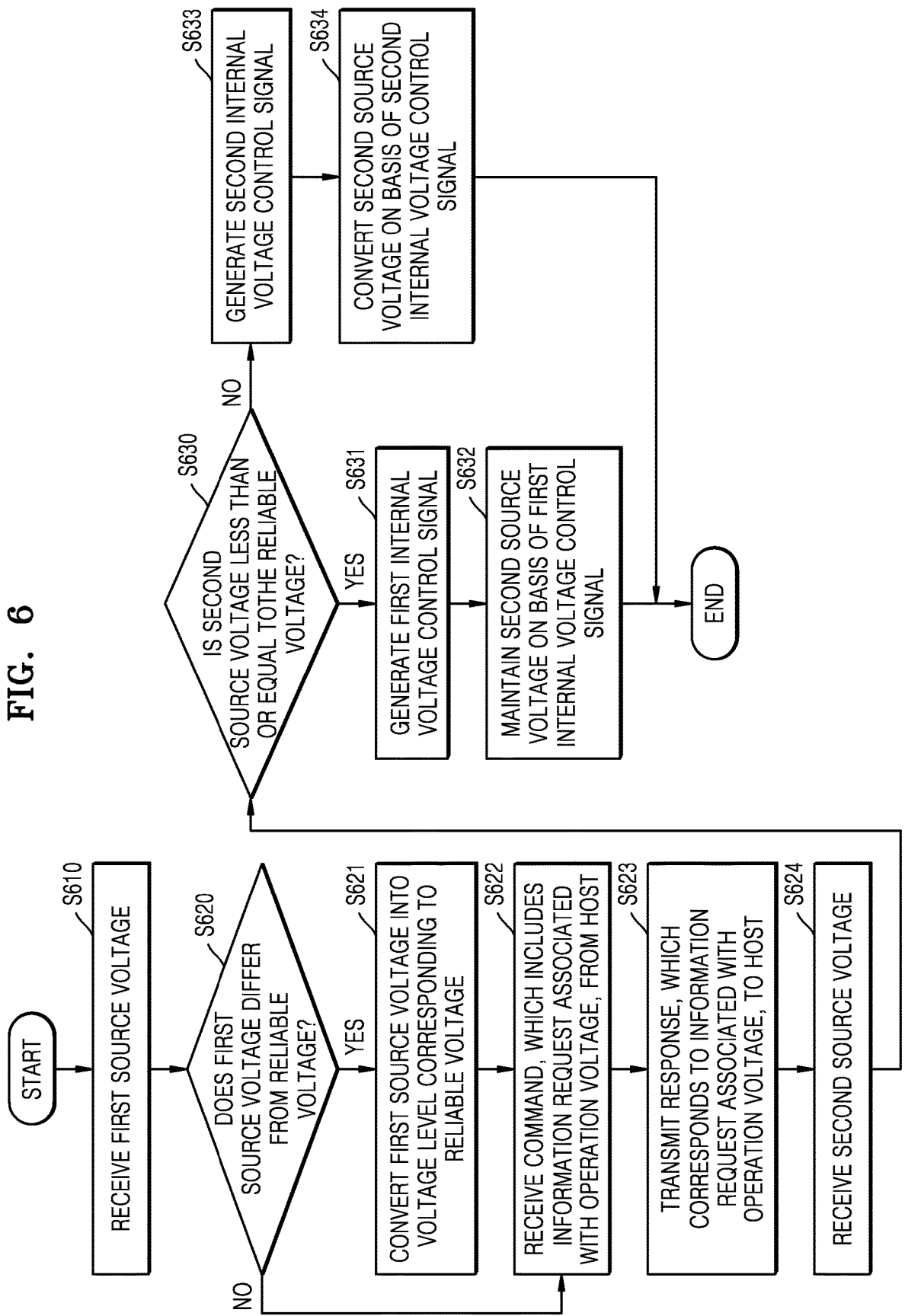
FIG. 6 is a flowchart illustrating an operating method of a storage device, according to an example embodiment.

FIG. 6 is a flowchart illustrating an operating method of a storage device, according to an example embodiment. In detail, FIG. 6 is a flowchart illustrating an operating method of the storage device 320 of FIG. 2.

In operation S610, the storage device may receive a first source voltage. When a storage system is initially booted, the storage device may receive the first source voltage. The storage device may receive the first source voltage from a PMIC. According to example embodiments, the first source voltage may have a voltage level which is higher than an operation voltage of the storage device.

In operation S620, the storage device may determine whether the first source voltage differs from a voltage level of a target voltage. When the first source voltage differs from the target voltage in operation S621 (Yes), the storage device may convert the first source voltage into a voltage level corresponding to the target voltage. When the first source voltage is higher than the target voltage, the storage device may generate an initial internal voltage control signal for converting the first source voltage. The storage device may convert a voltage level of the first source voltage into a voltage level corresponding to the target voltage on the basis of the initial internal voltage control signal. When the first source voltage does not differ from the target voltage in operation S622 (No), the storage device may perform operation S622.

In operation S622, the storage device may receive a command, which includes an information request associated with the operation voltage, from a host. In operation S623, the storage device may transmit a response, which corresponds to the information request associated with the operation voltage, to the host. The host may perform control so that the PMIC provides a second source voltage to the storage device, on the basis of the response.

In operation S624, the storage device may receive a second source voltage. The storage device may receive the second source voltage instead of the first source voltage from the PMIC.

In operation S630, the storage device may determine whether the second source voltage is lower than or equal to the target voltage. The storage device may generate an internal voltage control signal indicating whether to convert the second source voltage, on the basis of the second source voltage. The storage device may generate the internal voltage control signal on the basis of comparing the second source voltage with the target voltage.

When the second source voltage is lower than or equal to the target voltage in operation S631 (Yes), the storage device may generate the first internal voltage control signal. When the second source voltage is an operation voltage of the storage device, the storage device may generate the first internal voltage control signal. For example, assuming that a voltage level of the second source voltage is about 2.5 V and a voltage level of the target voltage is about 2.6 V, the storage device may generate the first internal voltage control signal IVCS1.

In operation S632, the storage device may maintain the second source voltage on the basis of the first internal voltage control signal. The storage device may not convert a voltage level of the second source voltage on the basis of the first internal voltage control signal and may provide the second source voltage to a non-volatile memory of the storage device.

When the second source voltage is higher than the target voltage in operation S633 (No), the storage device may generate the second internal voltage control signal. For example, assuming that a voltage level of the second source voltage is about 2.7 V and a voltage level of the target voltage is about 2.6 V, the storage device may generate the second internal voltage control signal.

In operation S634, the storage device may convert the second source voltage on the basis of the second internal voltage control signal. The storage device may convert a voltage level of the second source voltage into a voltage level corresponding to the target voltage on the basis of the second internal voltage control signal IVCS2. The storage device may convert a voltage level of the second source voltage on the basis of the second internal voltage control signal and may provide the second source voltage to the non-volatile memory of the storage device.

Figure 7:
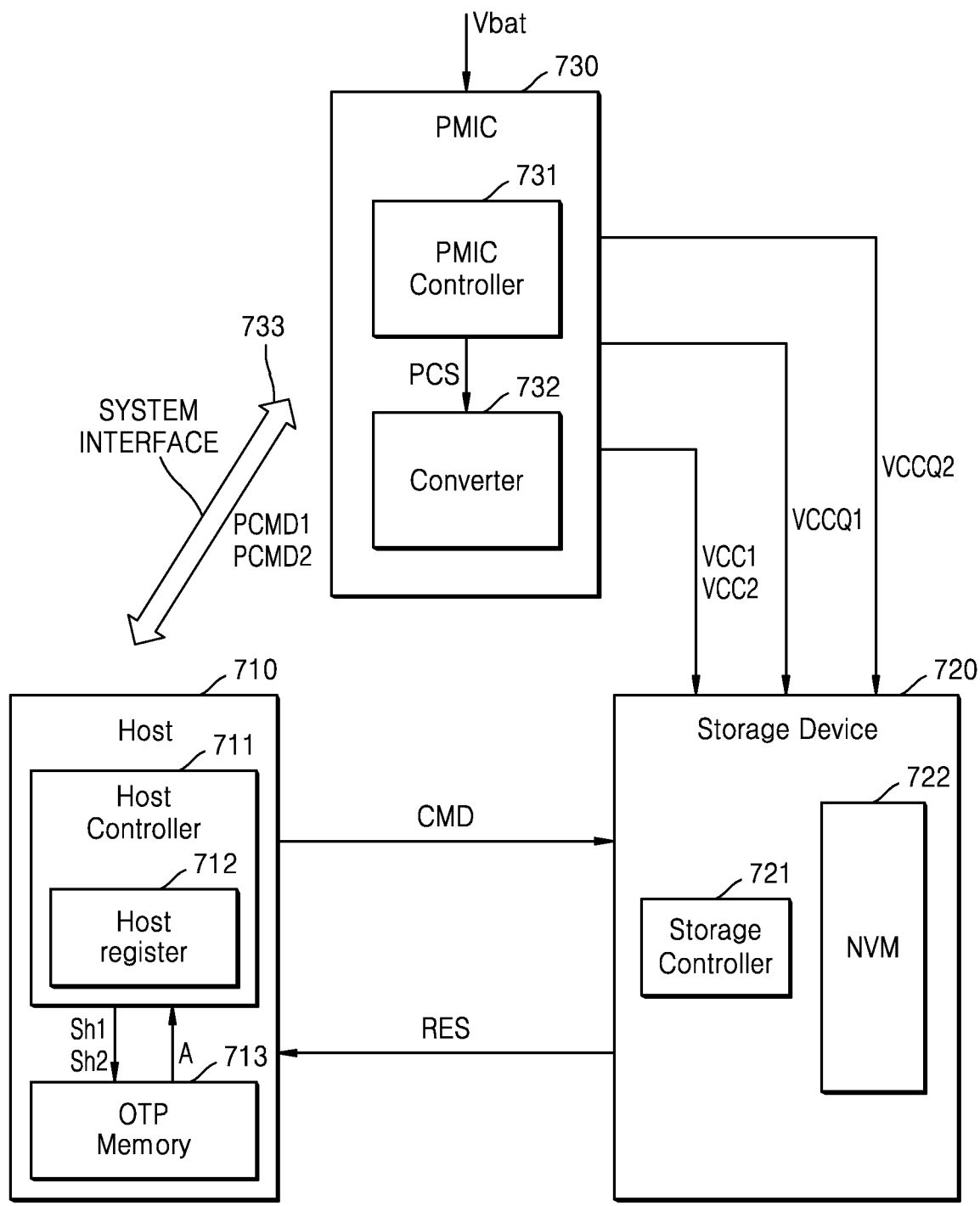
FIG. 7 is a block diagram illustrating a storage system including a one-time-programmable (OTP) memory device, according to an example embodiment.

FIG. 7 is a block diagram illustrating a storage system 700 including a OTP memory device, according to an example embodiment.

Referring to FIG. 7, the storage system 700 may include a host 710, a storage device 720, and a PMIC 730. The storage system 700, the host 710, the storage device 720, and the PMIC 730 of FIG. 7 may respectively correspond to the storage system 300, the host 310, the storage device 320, and the PMIC 330 of FIG. 2, and thus, repeated descriptions thereof are omitted.

The host 710 may include a host controller 711 and a OTP memory device 713. The host controller 711 may include a host register 712. The host register 712 may function as a command queue CQ of the host controller 711.

The host controller 711 may generate voltage control signals (for example, first and second voltage control signals) PCMD1 and PCMD2 for controlling the PMIC 730 so that the PMIC 730 provides a source voltage to the storage device 720. The voltage control signals PCMD1 and PCMD2 may denote a PMIC command for controlling voltage levels of source voltages (for example, first and second source voltages) VCC1 and VCC2 provided to the storage device 720 by the PMIC 730. The first voltage control signal PCMD1 may denote a command for controlling the PMIC 730 so that the PMIC 730 provides the first source voltage VCC1 to the storage device 720. The second voltage control signal PCMD2 may denote a command for controlling the PMIC 730 so that the PMIC 730 provides the second source voltage VCC2 to the storage device 720.

The second source voltage VCC2 may have a voltage level which differs from that of the first source voltage VCC1. In an example embodiment, the second source voltage VCC2 may be lower in voltage level than the first source voltage VCC1. For example, the first source voltage VCC1 may be about 2.7 V, and the second source voltage VCC2 may be about 2.5 V.

The host 710 may sequentially store the voltage control signals PCMD1 and PCMD2 which are to be transmitted to the PMIC 730 in the host register 712 and may transmit the voltage control signals PCMD1 and PCMD2 to the PMIC 730. When the storage system 700 is initially booted, the host 710 may generate the first voltage control signal PCMD1.

The host 710 may transmit a command CMD, including a characteristic information request of the storage device 720, to the storage device 720. The host 710 may receive a response RES corresponding to the characteristic information request from the storage device 720. The host 710 may check a version of the storage device 720 on the basis of the response RES corresponding to the characteristic information request. For example, the host 710 may check whether the version of the storage device 720 is UFS 3.1, UFS 2.1, or another version.

An operation, where the host 710 transmits the command CMD to the storage device 720 and receives the response RES from the storage device 720, may be performed when the storage system 700 is initially booted and may not be performed in booting after initial booting.

The OTP memory device 713 may denote a memory device where data is written through a one-time program operation and a read operation is allowed a plurality of times. The OTP memory device 713 may include source voltage information. The OTP memory device 713 may include information about an operation voltage of the storage device 720. The OTP memory device 713 may include electrically erasable programmable read only memory (EEPROM), flash memory, eFuse, and anti-fuse.

The host 710 may output the voltage control signals PCMD1 and PCMD2 on the basis of a connection relationship of the OTP memory device 713. The OTP memory device 713 may be connected to the host register 712. When the OTP memory device 713 is connected to the host register 712, the host controller 711 may output the first voltage control signal PCMD1. When the OTP memory device 713 is not connected to the host register 712, the host controller 711 may output the second voltage control signal PCMD2.

The host 710 may generate connection control signals (for example, first and second connection control signals) sh1 and sh2 for controlling a connection between the OTP memory device 713 and the host register 712, on the basis of the response RES. The host controller 711 may check a version of the storage device 720 from the response RES and may generate the connection control signals sh1 and sh2 on the basis of the version of the storage device 720. According to example embodiments, the host controller 711 may obtain information about the version of the storage device 720 from the response RES. The host controller 711 may check the version of the storage device 720 which has transmitted the response RES to the host 710, on the basis of the information about the version of the storage device 720. The host controller 711 may generate the connection control signals sh1 and sh2 when the storage system 700 is initially booted.

When the version of the storage device 720 is a first version, the host controller 711 may generate the first connection control signal sh1. The first connection control signal sh1 may perform control to maintain a connection between the OTP memory device 713 and the host register 712. For example, when the version of the storage device 720 is UFS 2.1, the host controller 711 may generate the first connection control signal sh1.

When the version of the storage device 720 is a second version, the host controller 711 may generate the second connection control signal sh2. The second connection control signal sh2 may perform control to disconnect the connection between the OTP memory device 713 and the host register 712. For example, when the version of the storage device 720 is UFS 3.1, the host controller 711 may generate the second connection control signal sh2. The connection between the OTP memory device 713 and the host register 712 may be disconnected based on the second connection control signal sh2.

The host controller 711 may output one of the first voltage control signal PCMD1 and the second voltage control signal PCMD2 on the basis of the connection between the OTP memory device 713 and the host register 712.

The host controller 711 may provide the first voltage control signal PCMD1 to the PMIC 730 on the basis of the first connection control signal sh1. When the host controller 711 generates the first connection control signal sh1, the connection between the OTP memory device 713 and the host register 712 may be maintained, and the host controller 711 may output the first voltage control signal PCMD1. The PMIC 730 may provide the first source voltage VCC1 to the storage device 720 on the basis of the first voltage control signal PCMD1. The storage device 720 may receive the first source voltage VCC1 through a first pin.

The host controller 711 may provide the second voltage control signal PCMD2 to the PMIC 730 on the basis of the second connection control signal sh2. When the host controller 711 generates the second connection control signal sh2, the connection between the OTP memory device 713 and the host register 712 may be disconnected, and the host controller 711 may output the second voltage control signal PCMD2. The PMIC 730 may provide the second source voltage VCC2 to the storage device 720 on the basis of the second voltage control signal PCMD2. The storage device 720 may receive the second source voltage VCC2 through a first voltage signal pin (for example, P4 of FIG. 1).

The host controller 711 may output the voltage control signals PCMD1 and PCMD2 on the basis of a state signal A, indicative of a connection state between the OTP memory device 713 and the host register 712. The state signal A may be provided to the host controller 711 whenever booted. For example, when the state signal A is at a logic high level, the host controller 711 may output the first voltage control signal PCMD1. When the state signal A is at a logic low level, the host controller 711 may output the second voltage control signal PCMD2.

Figure 8:
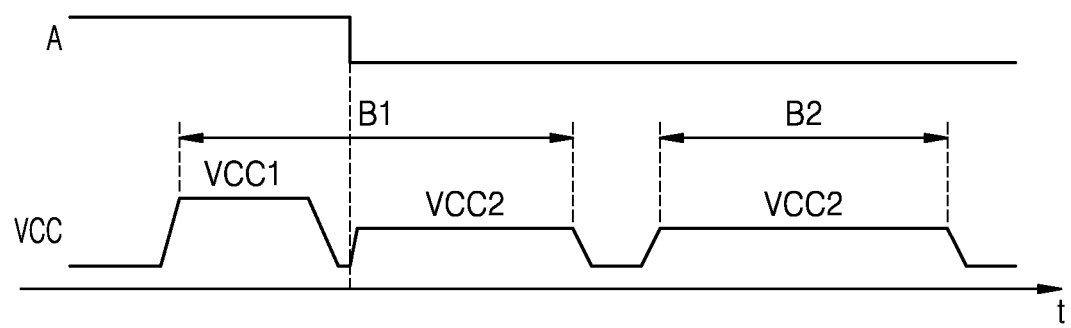
FIG. 8 is a diagram for describing a source voltage and a connection signal of an OTP memory device according to an example embodiment.
Figure 9:
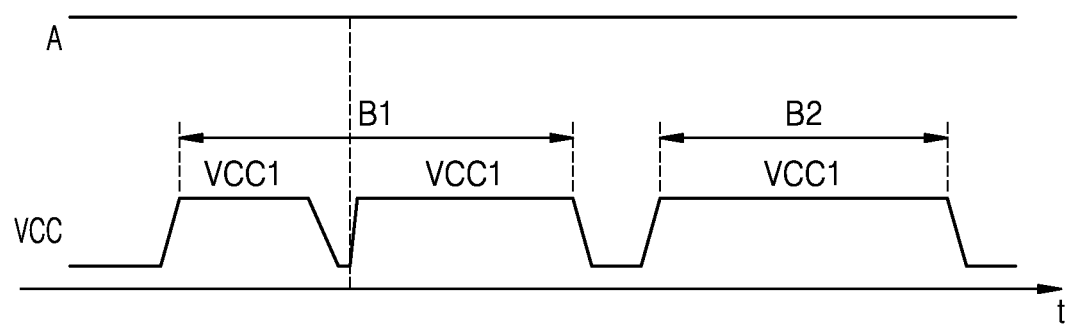
FIG. 9 is a diagram for describing a source voltage and a connection signal of an OTP memory device according to an example embodiment.

FIGS. 8 and 9 are diagrams for describing a source voltage and a connection signal of an OTP memory device according to an example embodiment. In detail, FIGS. 8 and 9 are diagrams showing a state signal A and a voltage level of a source voltage provided to a storage device. Hereinafter, FIGS. 7, 8, and 9 will be referred to together.

In FIG. 8, a case where a version of the storage device 720 is a second version may be assumed. When initially booted, the OTP memory device 713 may be connected to the host register 712. The state signal A may be at a logic high level. In a first booting period B1, the host 710 may generate the first voltage control signal PCMD1. Based on the first voltage control signal PCMD1, a first source voltage VCC1 may be provided to the storage device 720. The host 710 may receive a response RES, which corresponds to an information request associated with an operation voltage, from the storage device 720.

Because the version of the storage device 720 is the second version, the host controller 711 may generate the second connection control signal sh2. A connection between the OTP memory device 713 and the host register 712 may be disconnected based on the second connection control signal sh2, and the state signal A may be at a logic low level. The host controller 711 may provide the second voltage control signal PCMD2 to the PMIC 730. Based on the second voltage control signal PCMD2, a second source voltage VCC2 may be provided to the storage device 720.

In a second booting period B2, the host controller 711 may output the second voltage control signal PCMD2. Because the connection between the OTP memory device 713 and the host register 712 is disconnected in the first booting period B1, a connection state of the first booting period B1 may be maintained in booting after the first booting period B1. When the state signal A is at a logic low level, the host controller 711 may output the second voltage control signal PCMD2. Based on the second voltage control signal PCMD2, a second source voltage VCC2 may be provided to the storage device 720.

In FIG. 9, a case where a version of the storage device 720 is the first version may be assumed. When initially booted, the OTP memory device 713 may be connected to the host register 712. The state signal A may be at a logic high level. In a first booting period B1, the host 710 may generate the first voltage control signal PCMD1. Based on the first voltage control signal PCMD1, a first source voltage VCC1 may be provided to the storage device 720. The host 710 may receive a response RES, which corresponds to an information request associated with an operation voltage, from the storage device 720.

Because the version of the storage device 720 is the first version, the host controller 711 may generate the first connection control signal sh1. The connection between the OTP memory device 713 and the host register 712 may be maintained based on the first connection control signal sh1, and the state signal A may be at a logic high level. The host controller 711 may provide the first voltage control signal PCMD1 to the PMIC 730. Based on the first voltage control signal PCMD1, the first source voltage VCC1 may be provided to the storage device 720.

In a second booting period B2, the host controller 711 may output the first voltage control signal PCMD1. The connection between the OTP memory device 713 and the host register 712 may be maintained in booting after the first booting period B1. When the state signal A is at a logic high level, the host controller 711 may output the first voltage control signal PCMD1. Based on the first voltage control signal PCMD1, the first source voltage VCC1 may be provided to the storage device 720.

Figure 10:
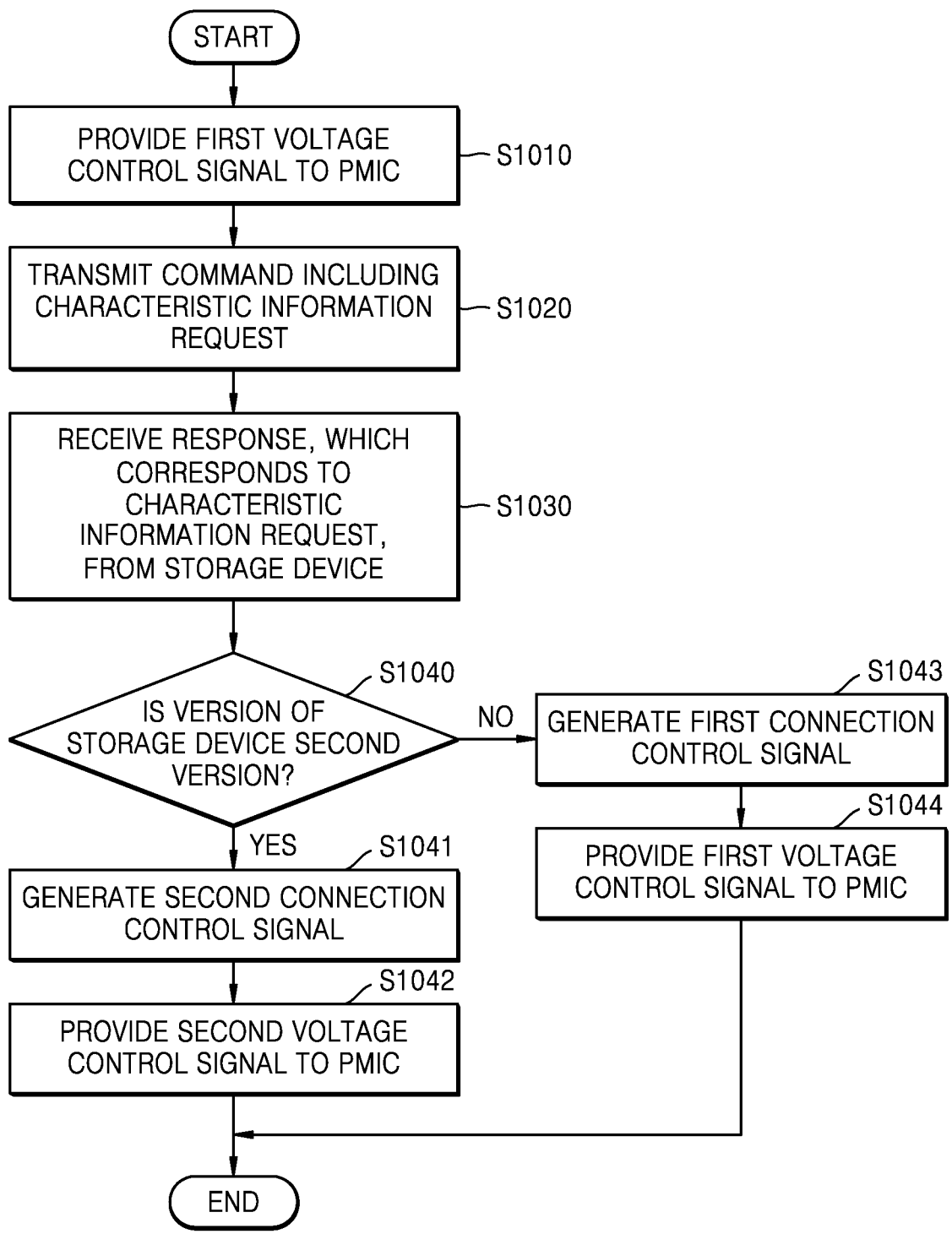
FIG. 10 is a flowchart illustrating an operating method of a host, according to an example embodiment.

FIG. 10 is a flowchart illustrating an operating method of a host, according to an example embodiment. In detail, FIG. 10 is a flowchart illustrating an operating method of the host 710 of FIG. 7.

In operation S1010, the host may provide a first voltage control signal to a PMIC. When a storage system is initially booted, the host may generate the first voltage control signal. The first voltage control signal may perform control so that the PMIC provides a first source voltage to a storage device.

In operation S1020, the host may transmit a command including a characteristic information request of the storage device. In operation S1030, the host may receive a response, which corresponds to the characteristic information request, from the storage device.

In operation S1040, the host may determine whether a version of the storage device is the second version. The host may generate a connection control signal on the basis of the version of the storage device. The host may obtain information about the version of the storage device from the response of the storage device and may check the version of the storage device which has transmitted the response to the host, on the basis of information about the version of the storage device.

When the version of the storage device is the second version in operation S1041 (Yes), the host may generate a second connection control signal. The second connection control signal may perform control to disconnect a connection between the OTP memory device and a host register. Based on the second connection control signal, the connection between the OTP memory device and the host register may be disconnected.

In operation S1042, the host may provide a second voltage control signal to the PMIC on the basis of the second connection control signal. The second voltage control signal may perform control so that the PMIC provides a second source voltage to the storage device. The second source voltage may have a voltage level which differs from that of the first source voltage. The second source voltage may be lower in voltage level than the first source voltage. The second source voltage may be provided to the storage device.

When the version of the storage device is the first version in operation S1043 (No), the host may generate a first connection control signal. The first connection control signal may perform control to maintain the connection between the OTP memory device and the host register. Based on the first connection control signal, the connection between the OTP memory device and the host register may be maintained.

In operation S1044, the host may provide a first voltage control signal to the PMIC on the basis of the first connection control signal. The first voltage control signal may perform control so that the PMIC provides a first source voltage to a storage device. The first source voltage may be provided to the storage device.

Operations S1010 to S1040 and operations S1041 to S1043 may be performed when the storage system is initially booted and may be omitted in booting after initial booting. Because operations S1010 to S1040 and operations S1041 to S1043 are omitted in booting after initial booting, the storage device may be prevented from being exposed to a high source voltage whenever booted. In booting after initial booting, a voltage control signal may be output based on a connection state.

Figure 11:
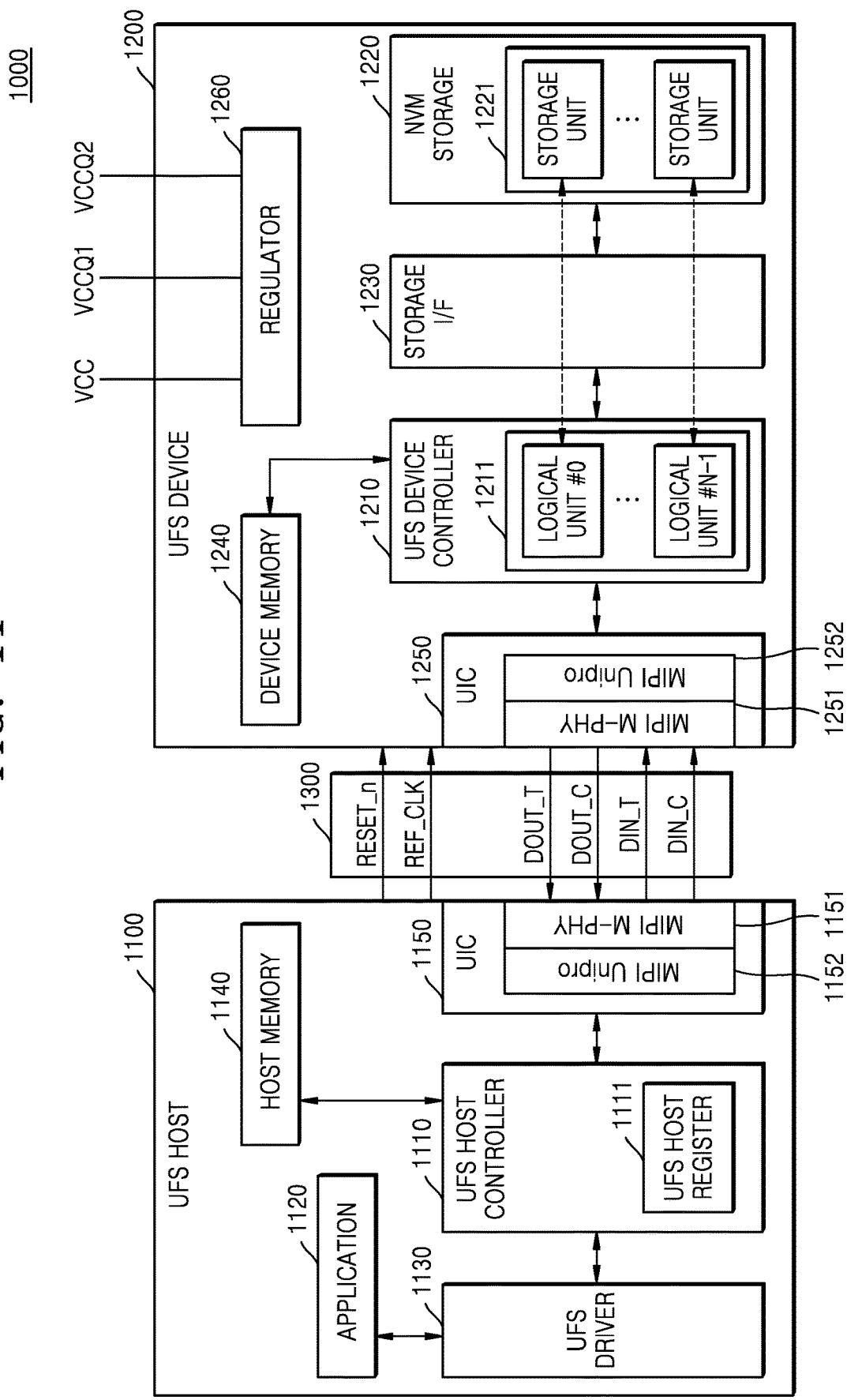
FIG. 11 is a diagram for describing a universal flash storage (UFS) system according to an example embodiment.

FIG. 11 is a diagram for describing a UFS system 1000 according to an example embodiment. The UFS system 1000 may be a system which is based on UFS standard defined in joint electron device engineering council (JEDEC) and may include a UFS host 1100, a UFS device 1200, and a UFS interface 1300. The descriptions of the storage systems of FIGS. 1, 2, and 7 may be applied to the UFS system 1000 of FIG. 11 within a range which does not conflict with the following description of FIG. 11.

Referring to FIG. 11, the UFS host 1100 may be connected to the UFS device 1200 through the UFS interface 1300. When the host 200 of FIG. 1 is an AP, the UFS host 1100 may be implemented as a portion of a corresponding AP. The UFS host controller 1110 may correspond to the host controller 220 of FIG. 1. The UFS device 1200 may correspond to the storage device 100 of FIG. 1, and a UFS storage controller 1210 and a non-volatile memory 1220 may respectively correspond to the storage controller 120 and the non-volatile memory 130 of FIG. 1.

The UFS host 1100 may include a UFS host controller 1110, an application 1120, a UFS driver 1130, a host memory 1140, and a UFS interconnect UIC layer 1150. The UFS device 1200 may include a UFS device controller 1210, a non-volatile memory 1220, a storage interface 1230, a device memory 1240, a UIC layer 1250, and a regulator 1260. The non-volatile memory 1220 may be configured with a plurality of memory units 1221, and each of the memory units 1221 may include a VNAND flash memory having a 2D or 3D structure, but may include a different kind of non-volatile memory such as PRAM and/or RRAM. The UFS device controller 1210 may be connected to the non-volatile memory 1220 through the storage interface 1230. The storage interface 1230 may be implemented to observe a standard protocol such as Toggle or ONFI.

The application 1120 may denote a program which desires to communicate with the UFS device 1200 so as to use a function of the UFS device 1200. The application 1120 may transmit an input-output request IOR to the UFS driver 1130, for an input/output on the UFS device 1200. The input-output request IOR may denote a data read request, a data write request, and/or a data discard request, but example embodiments are not limited thereto.

The UFS driver 1130 may manage the UFS host controller 1110 through UFS host controller interface (HCI) (UFS-HCI). The UFS driver 1130 may convert an input-output request, generated by the application 1120, into a UFS command defined by UFS standard and may transfer a converted UFS command to the UFS host controller 1110. One input-output request may be converted into a plurality of UFS commands. The UFS command may be a command fundamentally defined by small computer system interface (SCSI) standard, but may be a UFS standard dedicated command.

The UFS host controller 1110 may transmit the UFS command, obtained through conversion by the UFS driver 1130, to the UIC layer 1250 of the UFS device 1200 through the UIC layer 1150 and the UFS interface 1300. In such a process, the UFS host register 1111 of the UFS host controller 1110 may function as a command queue CQ.

The UIC layer 1150 of the UFS host 1100 may include an MIPI M-PHY 1151 and an MIPI UniPro 1152, and the UIC layer 1250 of the UFS device 1200 may include an MIPI M-PHY 1251 and an MIPI UniPro 1252.

The UFS interface 1300 may include a line which transmits a reference clock signal REF_CLK, a line which transmits a hardware reset signal RESET_n corresponding to the UFS device 1200, a pair of lines which transmits a differential input signal pair DIN_t and DIN_c, and a pair of lines which transmits a differential output signal pair DOUT_t and DOUT_c.

The UFS interface 101 may support a plurality of lanes, and each of the plurality of lanes may be implemented as a differential pair. For example, the UFS interface 101 may include one or more receive lanes and one or more transmit lanes. In FIG. 11, the pair of lines which transmits the differential input signal pair DIN_t and DIN_c may configure the receive lane, and the pair of lines which transmits the differential output signal pair DOUT_t and DOUT_c may configure the transmit lane. In FIG. 11, one transmit lane and one receive lane are illustrated, but the number of transmit lanes and receive lanes may be changed.

The receive lane and the transmit lane may transmit data on the basis of a serial communication scheme, and full-duplex communication between the UFS host 1100 and the UFS device 1200 may be implemented based on a structure where the receive lane is separated from the transmit lane. That is, the UFS device 1200 may transmit data to the UFS host 1100 through the transmit lane while receiving data from the UFS host 1100 through the receive lane. Also, control data such as a command from the UFS host 1100 to the UFS device 1200 and user data, which is to be stored in the non-volatile memory 1220 of the UFS device 1200 by the UFS host 1100 or is to be read from the non-volatile memory 1220, may be transmitted through the same lane. Therefore, in addition to a pair of receive lanes and a pair of transmit lanes, a separate lane for transmitting data may not be further included between the UFS host 1100 and the UFS device 1200.

The UFS device controller 1210 of the UFS device 1200 may overall control an operation of the UFS device 1200. The UFS device controller 1210 may manage the non-volatile memory 1220 through a logical unit (LU) 1211 which is a logical data storage unit. The number of LUs 1211 may be eight, but is not limited thereto. The UFS device controller 1210 may include a flash translation layer (FTL) and may convert a logical data address (for example, a logical block address (LBA)), transferred from the UFS host 1100, into a physical data address (for example, a physical block address (PBA)) by using address mapping information about the FTL. A logical block for storing the user data in the UFS system 1000 may have a size within a certain range. For example, a minimum size of a logical block may be set to about 4 Kbyte.

When a command from the UFS host 1100 is input to the UFS device 1200 through the UIC layer 1250, the UFS device controller 1210 may perform an operation based on a command input thereto, and when the operation is completed, the UFS device controller 1210 may transmit a completion response to the UFS host 1100.

For example, when the UFS host 1100 desires to store the user data in the UFS device 1200, the UFS host 1100 may transmit a data storage command to the UFS device 1200. When a ready-to-transfer response where transmission of user data is ready is received from the UFS device 1200, the UFS host 1100 may transmit the user data to the UFS device 1200. The UFS device controller 1210 may temporarily store the transmitted user data in the device memory 1240 and may store the user data, temporarily stored in the device memory 1240, at a selected position of the non-volatile memory 1220 on the basis of the address mapping information about the FTL.

As another example, when the UFS host 1100 desires to read the user data stored in the UFS device 1200, the UFS host 1100 may transmit a data read command to the UFS device 1200. The UFS device controller 1210, which has received a corresponding command, may read the user data from the non-volatile memory 1220 on the basis of the data read command and may temporarily store the read user data in the device memory 1240. In such a read process, the UFS device controller 1210 may detect and correct an error of the read user data by using an embedded error correction code (ECC) engine. In more detail, the ECC engine may generate parity bits corresponding to write data which is to be written in the non-volatile memory 1220, and the parity bits generated in this manner may be stored in the non-volatile memory 1220 together with the write data. In reading data from the non-volatile memory 1220, the ECC engine may correct an error of the read data by using the parity bits read from the non-volatile memory 1220 together with the read data and may output error-corrected read data.

Also, the UFS device controller 1210 may transmit the user data, temporarily stored in the device memory 1240, to the UFS host 1100. Furthermore, the UFS device controller 1210 may further include an advanced encryption standard (AES) engine. The AES engine may perform at least one of an encryption operation and a decryption operation on data input to the UFS device controller 1210 by using a symmetric-key algorithm.

The UFS host 1100 may store in order commands, which are to be transmitted to the UFS device 1200, in the UFS host register 1111 capable of functioning as a command queue and may transmit the commands to the UFS device 1200 in the order. In this case, even when a previously transmitted command is being still processed by the UFS device 1200 (i.e., before receiving a notification indicating that processing of the previously transmitted command by the UFS device 1200 is completed), the UFS host 1100 may transmit a next command, which is standing by in the command queue, to the UFS device 1200, and thus, the UFS device 1200 may receive the next command from the UFS host 1100 while the previously transmitted command is being processed. The maximum number of commands (queue depth) capable of being stored in the command queue may be, for example, 32. Also, the command queue may be implemented as a circular queue type in which each of a start and an end of a command column stored in a queue through a head point and a tail pointer.

Each of the plurality of memory units 1221 may include a memory cell array and a control circuit which controls an operation of the memory cell array. The memory cell array may include a 2D memory cell array or a 3D memory cell array. The memory cell array may include a plurality of memory cells, and each of the memory cells may include a cell (a single level cell (SLC)) storing 1-bit information or may include a cell, which stores 2 or more-bit information, such as a multi level cell (MLC), a triple level cell (TLC), and a quadruple level cell (QLC). The 3D memory cell array may include a vertical NAND string which is vertically oriented so that at least one memory cell is disposed on another memory cell.

VCC, VCCQ1, and VCCQ2 may each be input as a source voltage to the UFS device 1200. The VCC may be a main source voltage for the UFS device 1200 and may have a value of, for example, 2.4 V to 3.6 V. The VCCQ1 may be a source voltage for supplying a voltage having a low range and may have a value of, for example, 1.14 V to 1.26 V. The VCCQ2 may be a source voltage for supplying a voltage having a range which is lower than the VCC and higher than the VCCQ1 and may have a value of, for example, 1.7 V to 1.95 V. The source voltages may be supplied for each of the elements of the UFS device 1200 via the regulator 1260. The regulator 1260 may be implemented as a set of unit regulators respectively connected to different source voltages among the source voltages described above. According to example embodiments, the regulator 1260 may include a voltage controller (for example, the voltage controller 321 of FIG. 2).

Figure 12A:
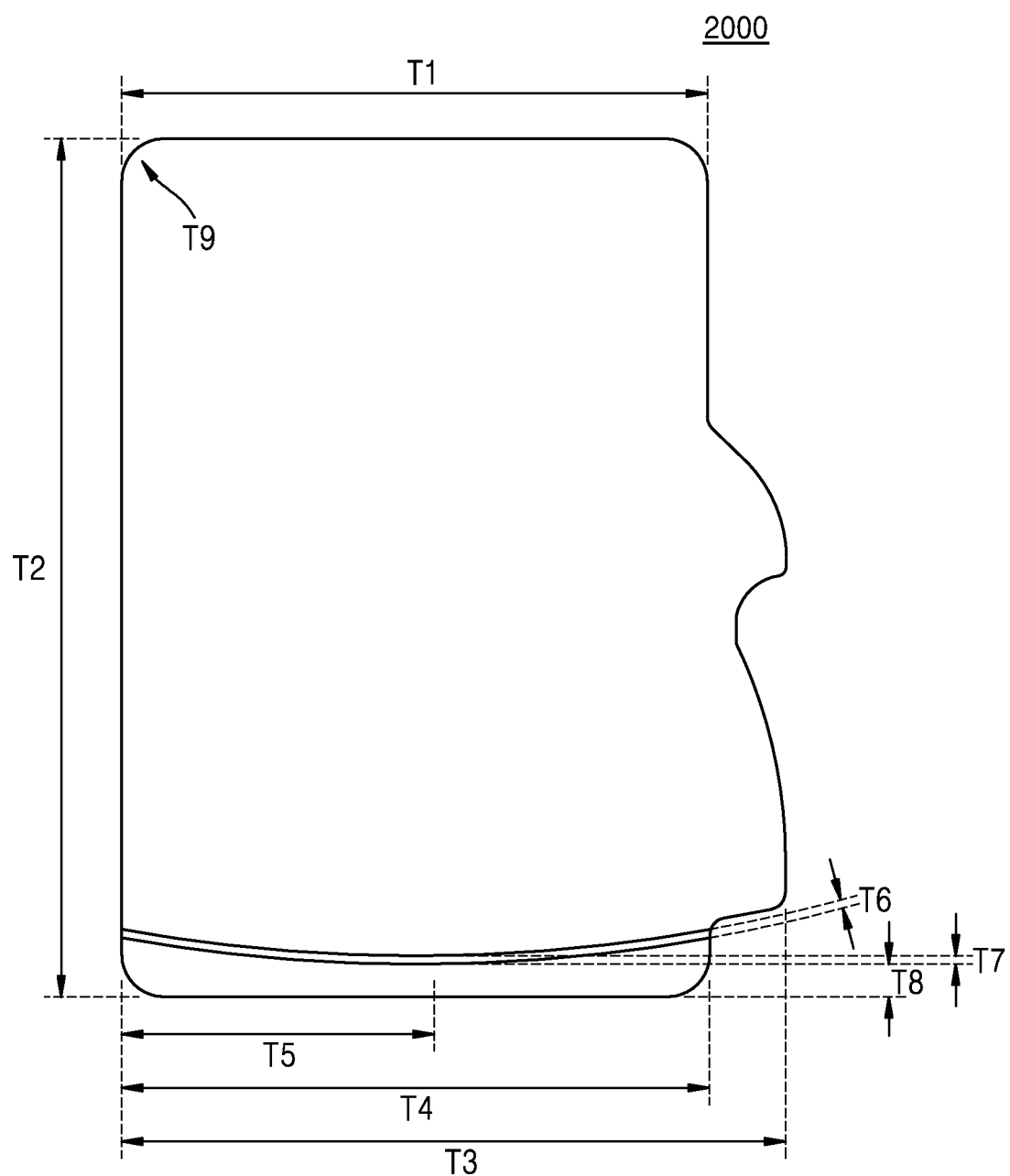
FIGS. 12A to 12C are diagrams for describing a form factor of a UFS card.
Figure 12B:
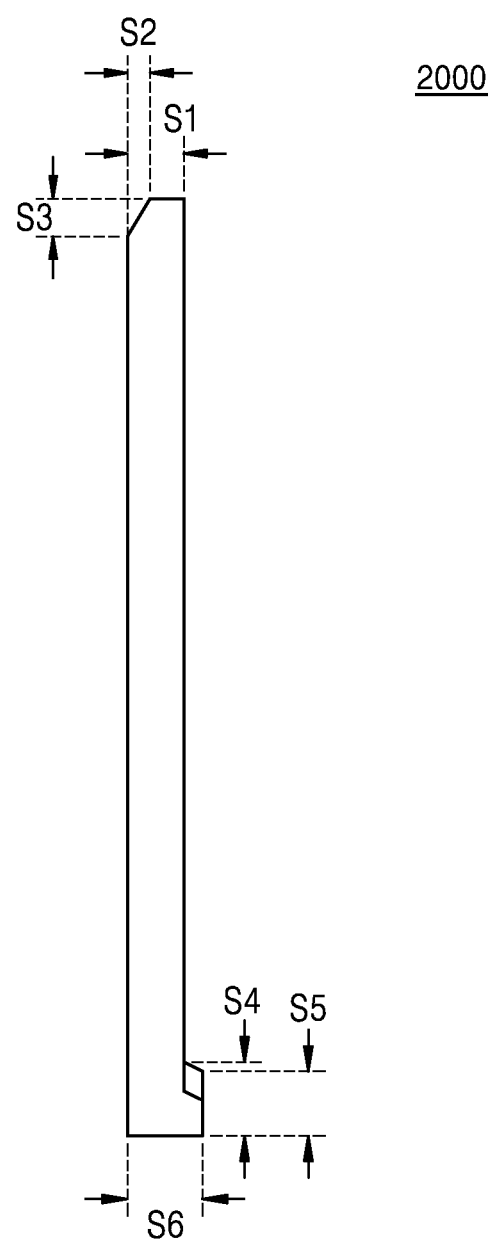
Figure 12C:
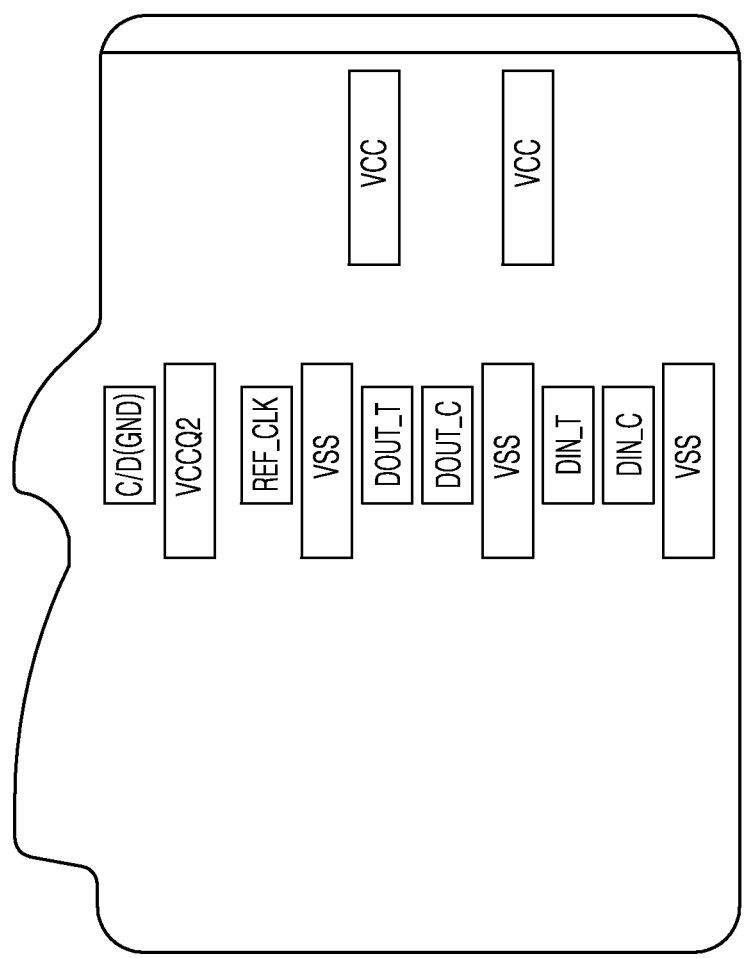

FIGS. 12A to 12C are diagrams for describing a form factor of a UFS card. When the UFS device 1200 described above with reference to FIG. 11 is implemented as the UFS card 2000 type, an external shape of the UFS card 2000 may be as illustrated in FIGS. 12A to 12C.

FIG. 12A illustrates a top view of the UFS card 2000 for example. Referring to FIG. 12A, it may be checked that the UFS card 2000 is based on a design wholly having a shark shape. In FIG. 12A, the UFS card 2000 may have a dimension as shown in the following Table 1.

TABLE 1

| Item | Dimension (mm) |
|------|----------------|
| T1 | 9.70 |
| T2 | 15.00 |
| T3 | 11.00 |
| T4 | 9.70 |
| T5 | 5.15 |
| T6 | 0.25 |
| T7 | 0.60 |
| T8 | 0.75 |
| T9 | R0.80 |

FIG. 12B illustrates a side view of the UFS card 2000 for example. In FIG. 12B, the UFS card 2000 may have a dimension value as shown in the following Table 2.

TABLE 2

| Item | Dimension (mm) |
|------|----------------|
| S1 | 0.74 ± 0.06 |
| S2 | 0.30 |
| S3 | 0.52 |
| S4 | 1.20 |
| S5 | 1.05 |
| S6 | 1.00 |

FIG. 12C illustrates a bottom view of the UFS card 2000 for example Referring to FIG. 12C, a plurality of pins for an electrical contact with a UFS slot may be provided in a bottom surface of the UFS card 2000, and a function of each of the plurality of pins will be described. Based on symmetry between a top surface and a bottom surface of the UFS card 2000, some (for example, T1 to T5 and T9) of pieces of information about dimensions described above with reference to FIG. 12A and Table 1 may be applied to the bottom view of the UFS card 2000 as shown in FIG. 12C.

A plurality of pins for an electrical connection with a UFS host may be provided in the bottom surface of the UFS card 2000, and the number of pins may be total 12 as in FIG. 12C. Each pin may have a rectangular shape, and a signal name corresponding to a pin is as shown in FIG. 12C. Information about each pin may refer to the following Table 3.

TABLE 3

| Signal Number | Signal Name | Description | Dimension (mm) |
|---|---|---|---|
| 1 | VSS | Ground (GND) | 3.00 × 0.72 ± 0.05 |
| 2 | DIN_C | Differential input signal (DIN_C is a negative node, | 1.50 × 0.72 ± 0.05 |
| 3 | DIN_T | DIN_T is a positive node) input from a host to the UFS card 2000 | |
| 4 | VSS | the same as No. 1 | 3.00 × 0.72 ± 0.05 |
| 5 | DOUT_C | Differential output signal (DOUT_C is a negative | 1.50 × 0.72 ± 0.05 |
| 6 | DOUT_T | node, DOUT_T is a positive node) output from the UFS card 2000 to the host | |
| 7 | VSS | the same as No. 1 | 3.00 × 0.72 ± 0.05 |
| 8 | REF_CLK | Reference clock provided from the host to the UFS card 2000 | 1.50 × 0.72 ± 0.05 |
| 9 | VCCQ2 | Source voltage which is mainly provided for PHY interface or controller and has a relatively lower value than Vcc | 3.00 × 0.72 ± 0.05 |
| 10 | C/D(GND) | Signal for card detection | 1.50 × 0.72 ± 0.05 |
| 11 | VSS | the same as No. 1 | 3.00 × 0.80 ± 0.05 |
| 12 | Vcc | Main source voltage | |

Figure 13:
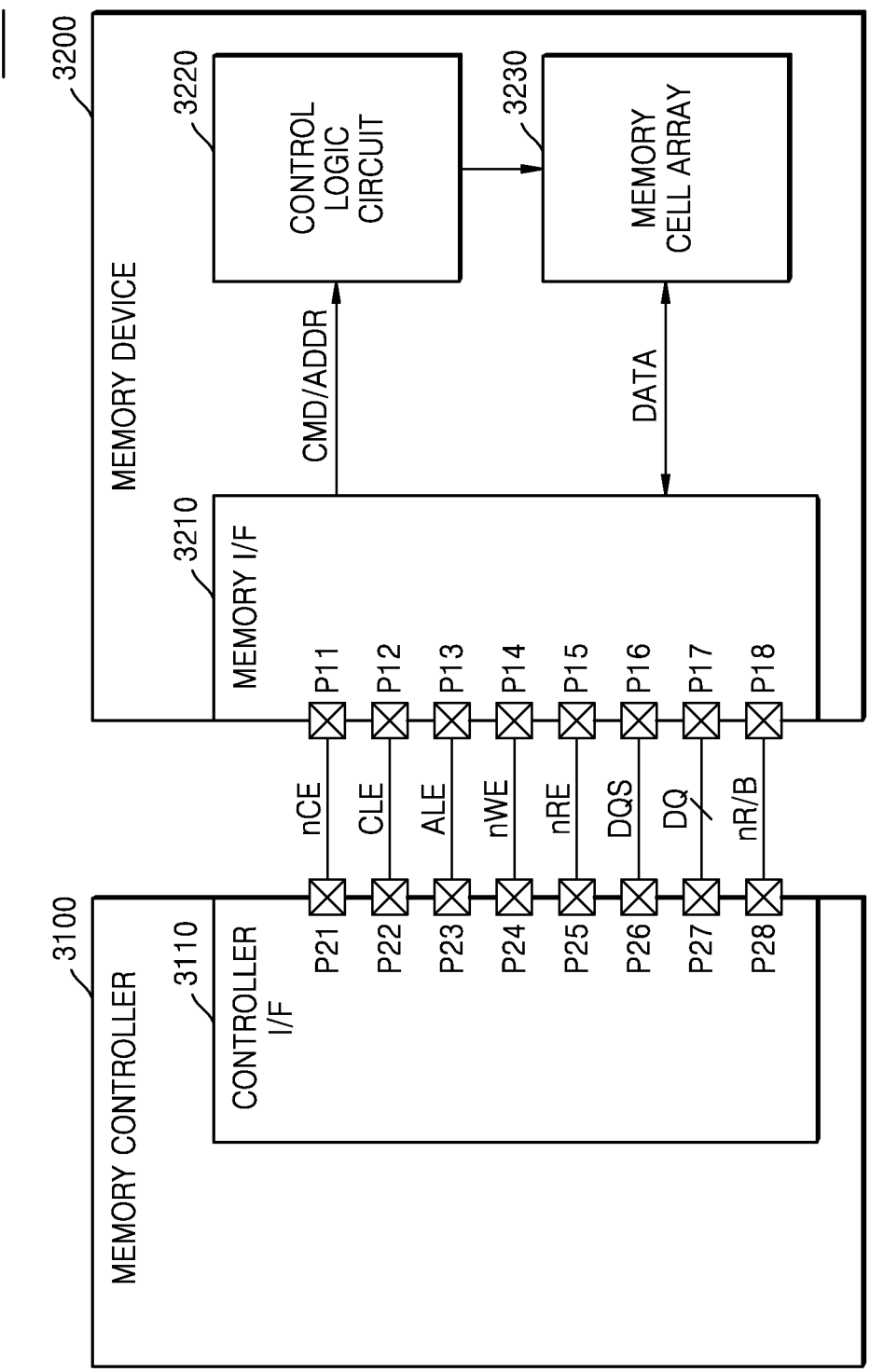
FIG. 13 is a block diagram illustrating a memory system according to an example embodiment.

FIG. 13 is a block diagram illustrating a memory system 3000 according to an example embodiment.

Referring to FIG. 13, the memory system 3000 may include a memory device 3200 and a memory controller 3100. The memory device 3200 may correspond to one of non-volatile memory devices communicating with the memory controller 3100 on the basis of one of a plurality of channels. For example, the memory device 3200 may correspond to the non-volatile memory 130 of FIG. 1, and the memory controller 3100 may correspond to the storage controller 120 of FIG. 1.

The memory device 3200 may include first to eighth pins P11 to P18, a memory interface circuit 3210, a control logic circuit 3220, and a memory cell array 3230. The memory interface circuit 3210 may receive a chip enable signal nCE from the memory controller 3100 through the first pin P11. The memory interface circuit 3210 may transmit and receive signals to and from the memory controller 3100 through the second to eighth pins P12 to P18 on the basis of the chip enable signal nCE. For example, when the chip enable signal nCE is in an enable state (for example, a low level), the memory interface circuit 3210 may transmit and receive signals to and from the memory controller 3100 through the second to eighth pins P12 to P18.

The memory interface circuit 3210 may receive a command latch enable signal CLE, an address latch enable signal ALE, and a write enable signal nWE from the memory controller 3100 through the second to fourth pins P12 to P14. The memory interface circuit 3210 may receive a data signal DQ from the memory controller 3100 through the seventh pin P17, or may transmit the data signal DQ to the memory controller 3100. A command CMD, an address ADDR, and data DATA may be transferred by using the data signal DQ. For example, the data signal DQ may be transferred through a plurality of data signal lines. In this case, the seventh pin P17 may include a plurality of pins corresponding to a plurality of data signals.

The memory interface circuit 3210 may obtain the command CMD from the data signal DQ received in an enable period (for example, a high level state) of the command latch enable signal CLE on the basis of toggle timings of a write enable signal nWE. The memory interface circuit 3210 may obtain the address ADDR from the data signal DQ received in an enable period (for example, a high level state) of the address latch enable signal ALE on the basis of the toggle timings of the write enable signal nWE.

In an example embodiment, the write enable signal nWE may maintain a static state (for example, a high level or a low level) and then may toggle between a high level and a low level. For example, the write enable signal nWE may toggle in a period where the command CMD or the address ADDR is transmitted. Therefore, the memory interface circuit 3210 may obtain the command CMD or the address ADDR on the basis of the toggle timings of the write enable signal nWE.

The memory interface circuit 3210 may receive a read enable signal nRE from the memory controller 3100 through the fifth pin P15. The memory interface circuit 3210 may receive a data strobe signal DQS from the memory controller 3100 through the sixth pin P16, or may transmit the data strobe signal DQS to the memory controller 3100.

In a data DATA output operation of the memory device 3200, the memory interface circuit 3210 may receive the read enable signal nRE toggling through the fifth pin P15 before outputting the data DATA. The memory interface circuit 3210 may generate the data strobe signal DQS toggling on the basis of toggling of the read enable signal nRE. For example, the memory interface circuit 3210 may generate the data strobe signal DQS starting to toggle after predetermined delay (for example, tDQSRE) with respect to a toggling start time of the read enable signal nRE. The memory interface circuit 3210 may transmit the data signal DQ including the data DATA on the basis of a toggle timing of the data strobe signal DQS. Therefore, the data DATA may be aligned with the toggle timing of the data strobe signal DQS and may be transmitted to the memory controller 3100.

In a data DATA input operation of the memory device 3200, when the data signal DQ including the data DATA is received from the memory controller 3100, the memory interface circuit 3210 may receive the data strobe signal DQS, toggling along with the data DATA, from the memory controller 3100. The memory interface circuit 3210 may obtain the data DATA from the data signal DQ on the basis of the toggle timing of the data strobe signal DQS. For example, the memory interface circuit 3210 may sample the data signal DQ at a rising edge and a falling edge of the data strobe signal DQS to obtain the data DATA.

The memory interface circuit 3210 may transmit a ready/busy output signal nR/B to the memory controller 3100 through the eighth pin P18. The memory interface circuit 3210 may transmit state information about the memory device 3200 to the memory controller 3100 by using the ready/busy output signal nR/B. When the memory device 3200 is a busy state (i.e., when internal operations of the memory device 3200 are being performed), the memory interface circuit 3210 may transmit the ready/busy output signal nR/B, indicating the busy state, to the memory controller 3100. When the memory device 3200 is a ready state (i.e., when the internal operations of the memory device 3200 are not performed or are completed), the memory interface circuit 3210 may transmit the ready/busy output signal nR/B, indicating the ready state, to the memory controller 3100. For example, while the memory device 3200 is reading the data DATA from the memory cell array 3230 in response to a page read command, the memory interface circuit 3210 may transmit the ready/busy output signal nR/B, indicating the busy state (for example, a low level), to the memory controller 3100. For example, while the memory device 3200 is programming the data DATA in the memory cell array 3230 in response to a program command, the memory interface circuit 3210 may transmit the ready/busy output signal nR/B, indicating the busy state, to the memory controller 3100.

The control logic circuit 3220 may overall control various operations of the memory device 3200. The control logic circuit 3220 may receive the command/address CMD/ADDR obtained from the memory interface circuit 3210. The control logic circuit 3220 may generate control signals for controlling the other elements of the memory device 3200 on the received command/address CMD/ADDR. For example, the control logic circuit 3220 may generate various control signals for programming the data DATA in the memory cell array 3230 or reading the data DATA from the memory cell array 3230.

The memory cell array 3230 may store the data DATA obtained from the memory interface circuit 3210 on the basis of control by the control logic circuit 3220. The memory cell array 3230 may output the stored data DATA to the memory interface circuit 3210 on the basis of control by the control logic circuit 3220.

The memory cell array 3230 may include a plurality of memory cells. For example, the plurality of memory cells may include flash memory cells. However, example embodiments are not limited thereto, and the memory cells may include resistive RAM (ReRAM) cells, ferroelectric RAM (FRAM) cells, phase change RAM (PRAM) cells, thyristor RAM (TRAM) cells, and magnetic RAM (MRAM) cells. Hereinafter, an example embodiment where memory cells are NAND flash memory cells will be mainly described.

The memory controller 3100 may include first to eighth pins P21 to P28 and a controller interface circuit 3110. The first to eighth pins P21 to P28 may correspond to the first to eighth pins P11 to P18 of the memory device 3200. The controller interface circuit 3110 may transmit a chip enable signal nCE to the memory device 3200 through the first pin P21. The controller interface circuit 3110 may transmit and receive signals to and from the memory device 3200 selected through the chip enable signal nCE and the second to eighth pins P22 to P28.

The controller interface circuit 3110 may transmit a command latch enable signal CLE, an address latch enable signal ALE, and a write enable signal nWE to the memory device 3200 through the second to fourth pins P22 to P24. The controller interface circuit 3110 may transmit a data signal DQ to the memory device 3200 through the seventh pin P27, or may receive the data signal DQ from the memory device 3200.

The controller interface circuit 3110 may transmit the data signal DQ, including a command CMD or an address ADDR, to the memory device 3200 together with the write enable signal nWE toggling. The controller interface circuit 3110 may transmit the data signal DQ including the command CMD to the memory device 3200 by transmitting the command latch enable signal CLE having an enable state and may transmit the data signal DQ including the address ADDR to the memory device 3200 by transmitting the address latch enable signal ALE having an enable state.

The controller interface circuit 3110 may transmit a read enable signal nRE to the memory device 3200 through the fifth pin P25. The controller interface circuit 3110 may receive a data strobe signal DQS from the memory device 3200 through the sixth pin P26, or may transmit the data strobe signal DQS to the memory device 3200.

In a data DATA output operation of the memory device 3200, the controller interface circuit 3110 may generate the read enable signal nRE toggling and may transmit the read enable signal nRE to the memory device 3200. For example, the controller interface circuit 3110 may generate the read enable signal nRE changed from a static state (for example, a high level or a low level) to a toggle state before the data DATA is output. Therefore, the memory device 3200 may generate the data strobe signal DQS toggling on the basis of the read enable signal nRE. The controller interface circuit 3110 may receive the data signal DQ including the data DATA from the memory device 3200 together with the data strobe signal DQS toggling. The controller interface circuit 3110 may obtain the data DATA from the data signal DQ on the basis of a toggle timing of the data strobe signal DQS.

In a data DATA input operation of the memory device 3200, the controller interface circuit 3110 may generate the data strobe signal DQS toggling. For example, the controller interface circuit 3110 may generate the data strobe signal DQS changed from a static state (for example, a high level or a low level) to a toggle state before the data DATA is transmitted. The controller interface circuit 3110 may transmit the data signal DQ including the data DATA to the memory device 3200 on the basis of toggle timings of the data strobe signal DQS.

The controller interface circuit 3110 may receive a ready/busy output signal nR/B from the memory device 3200 through the eighth pin P28. The controller interface circuit 3110 may determine state information about the memory device 3200 on the basis of the ready/busy output signal nR/B.

Figure 14:
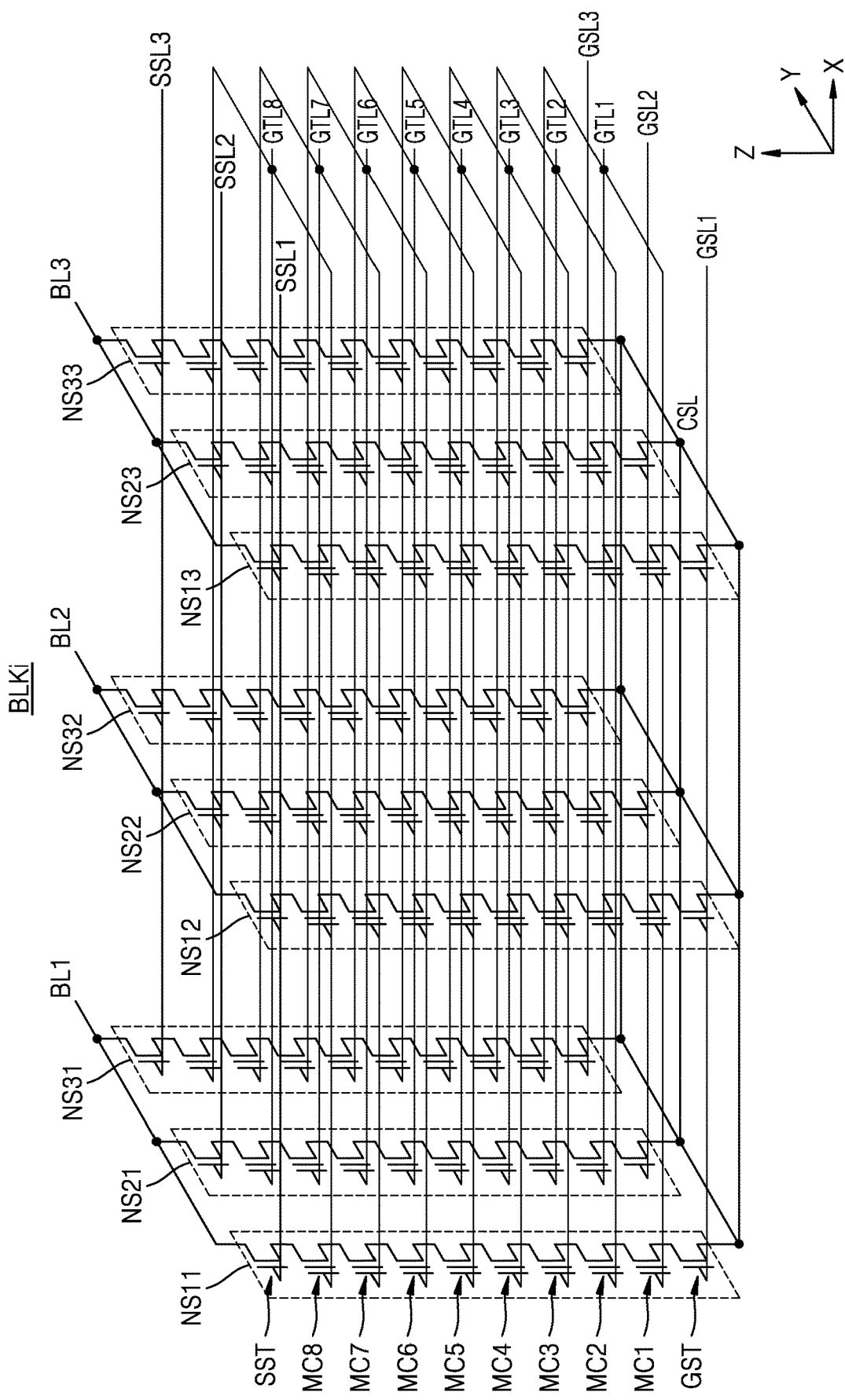
FIG. 14 is a diagram for describing a three-dimensional (3D) vertical NAND (3D VNAND) structure capable of being applied to a UFS device, according to an example embodiment.

FIG. 14 is a diagram for describing a 3D VNAND structure applicable to a UFS device, according to an example embodiment. When a storage module of the UFS device is implemented as a 3D VNAND type of flash memory, each of a plurality of memory blocks configuring the storage module may be expressed as an equivalent circuit illustrated in FIG. 14. A memory block BLKi illustrated in FIG. 14 may represent a 3D memory block formed in a 3D structure on a substrate. For example, a plurality of memory NAND strings included in the memory block BLKi may be formed in a direction vertical to the substrate.

Referring to FIG. 14, the memory block BLKi may include a plurality of memory NAND strings NS11 to NS33 connected between bit lines BL1 to BL3 and a common source line CSL. Each of the plurality of memory NAND strings NS11 to NS33 may include a string selection transistor SST, a plurality of memory cells MC1 to MC8, and a ground selection transistor GST. In FIG. 14, each of the plurality of memory NAND strings NS11 to NS33 is illustrated as including eight memory cells MC1 to MC8, but are not limited thereto.

The string selection transistor SST may be connected to corresponding string selection lines SSL1 to SSL3. Each of the plurality of memory cells MC1 to MC8 may be connected to corresponding gate lines GTL1 to GTL8. The gate lines GTL1 to GTL8 may correspond to word lines, and some of the gate lines GTL1 to GTL8 may correspond to dummy word lines. The ground selection transistor GST may be connected to corresponding ground selection lines GSL1 to GSL3. The string selection transistor SST may be connected to corresponding bit lines BL1 to BL3, and the ground selection transistor GST may be connected to the common source line CSL.

A word line (for example, WL1) having the same height may be connected in common, and the ground selection lines GSL1 to GSL3 and the string selection lines SSL1 to SSL3 may be apart from one another. In FIG. 14, it is illustrated that a memory block BLK is connected to eight gate lines GTL1 to GTL8 and three bit lines BL1 to BL3, but example embodiments are not limited thereto.

Figure 15:
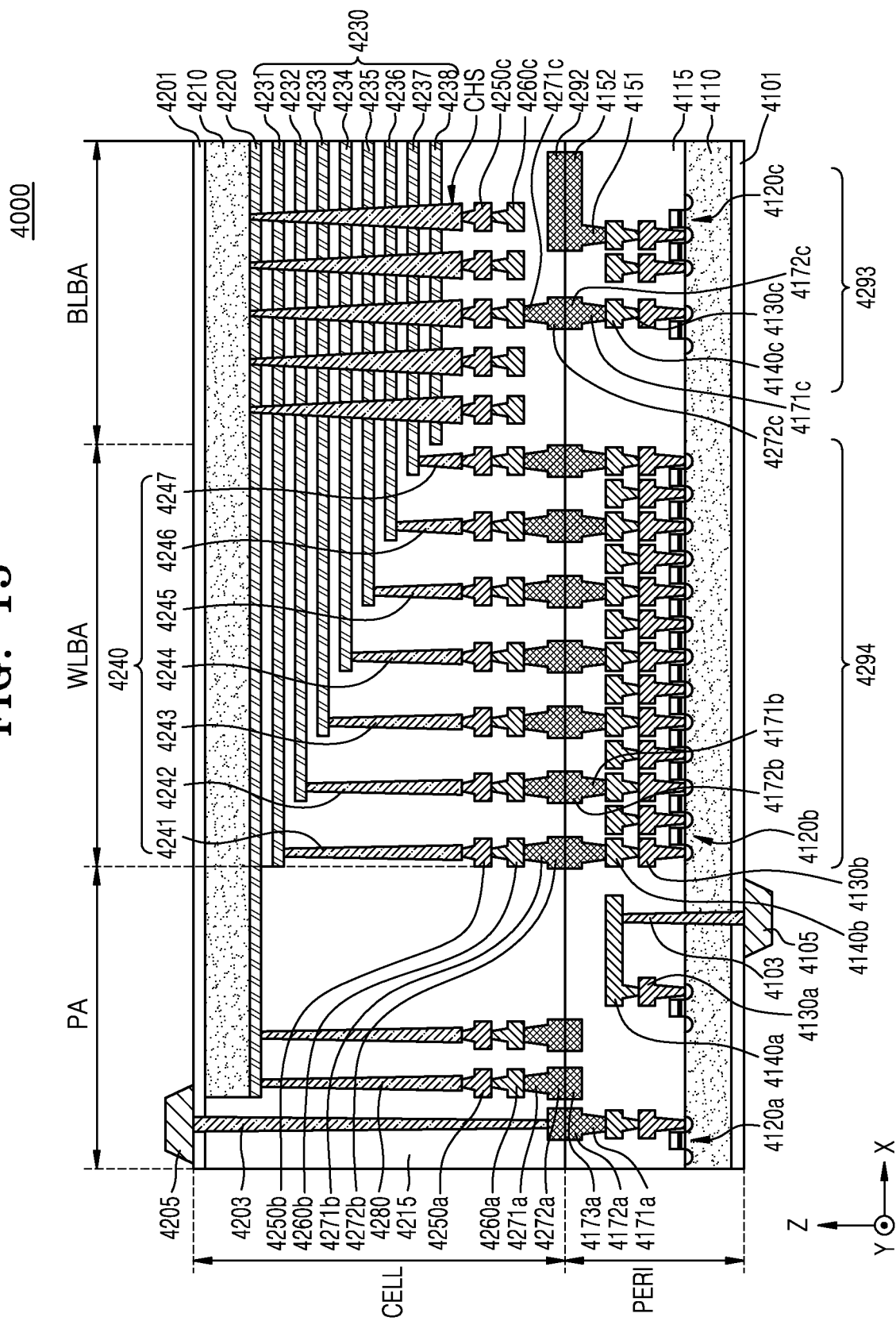
FIG. 15 is a diagram for describing a bonding vertical NAND (BVNAND) structure applicable to a UFS device, according to an example embodiment.

FIG. 15 is a diagram for describing a bonding vertical NAND (BVNAND) structure applicable to a UFS device, according to an example embodiment. Referring to FIG. 15, when a non-volatile memory included in the UFS device is implemented as a BVNAND type of flash memory, the non-volatile memory may have a structure illustrated in FIG. 15.

Referring to FIG. 15, a memory device 4000 may have a chip to chip (C2C) structure. The C2C structure may denote that an upper chip including a cell region CELL is manufactured on a first wafer, a lower chip including a peripheral circuit region PERI is manufactured on a second wafer which differs from the first wafer, and the upper chip is connected to the lower chip by a bonding manner. For example, the bonding manner may denote a manner where a bonding metal formed in an uppermost metal layer of the upper chip is electrically connected to a bonding metal formed in an uppermost metal layer of the lower chip. For example, when a bonding metal includes copper (Cu), the bonding manner may be a Cu—Cu bonding manner, and the bonding metal may include aluminum or tungsten.

Each of the peripheral circuit region PERI and the cell region CELL of the memory device 4000 may include an external pad bonding region PA, a word line bonding region WLBA, and a bit line bonding region BLBA.

The peripheral circuit region PERI may include a first substrate 4110, an interlayer insulation layer 4115, a plurality of circuit devices 4120*a*, 4120*b*, and 4120*c* formed in the first substrate 4110, a plurality of first metal layers 4130*a*, 4130*b*, and 4130*c* respectively connected to the plurality of circuit devices 4120*a*, 4120*b*, and 4120*c*, and a plurality of second metal layers 4140*a*, 4140*b*, and 4140*c* respectively formed on the plurality of first metal layers 4130*a*, 4130*b*, and 4130*c*. In an example embodiment, the first metal layers 4130*a*, 4130*b*, and 4130*c* may include tungsten which is relatively high in resistance, and the second metal layers 4140*a*, 4140*b*, and 4140*c* may include copper which is relatively low in resistance.

Herein, only the first metal layers 4130*a*, 4130*b*, and 4130*c* and the second metal layers 4140*a*, 4140*b*, and 4140*c* are illustrated and described, but example embodiments are not limited thereto and one or more metal layers may be further formed on the second metal layers 4140*a*, 4140*b*, and 4140*c*. At least some of the one or more metal layers formed on the second metal layers 4140*a*, 4140*b*, and 4140*c* may include aluminum having a resistance which is lower than copper included in the second metal layers 4140*a*, 4140*b*, and 4140*c*.

The interlayer insulation layer 4115 may be disposed on the first substrate 4110 to cover the plurality of circuit devices 4120*a*, 4120*b*, and 4120*c*, the plurality of first metal layers 4130*a*, 4130*b*, and 4130*c*, and the plurality of second metal layers 4140*a*, 4140*b*, and 4140*c* and may include an insulating material such as silicon oxide or silicon nitride.

Lower bonding metals 4171*b* and 4172*b* may be formed on the second metal layer 4140*b* of a word line bonding region WLBA. In the word line bonding region WLBA, the lower bonding metals 4171*b* and 4172*b* of the peripheral circuit region PERI may be electrically connected to upper bonding metals 4271*b* and 4272*b* of the cell region CELL by the bonding manner, and the lower bonding metals 4171*b* and 4172*b* and the upper bonding metals 4271*b* and 4272*b* may include aluminum, copper, or tungsten.

The cell region CELL may provide at least one memory block. The cell region CELL may include a second substrate 4210 and a common source line 4220. A plurality of word lines 4231 to 4238 (4230) may be stacked on the second substrate 4210 in a direction (a Z-axis direction) vertical to a top surface of the second substrate 4210. String selection lines and a ground selection line may be respectively disposed on and under the word lines 4230, and the plurality of word lines 4230 may be disposed between the string selection lines and the ground selection line.

In the bit line bonding region BLBA, a channel structure CH may extend in the direction vertical to the top surface of the second substrate 4210 and may pass through the word lines 4230, the string selection lines, and the ground selection lines. The channel structure CH may include a data storage layer, a channel layer, and a buried insulation layer, and the channel layer may be electrically connected to the first metal layer 4250*c* and the second metal layer 4260*c*. For example, the first metal layer 4250*c* may be a bit line contact, and the second metal layer 4260*c* may be a bit line. In an example embodiment, the bit line 4260*c* may extend in a first direction (a Y-axis direction) parallel to the top surface of the second substrate 4210.

In an example embodiment illustrated in FIG. 15, a region where the channel structure CH and the bit line 4260*c* are disposed may be defined as a bit line bonding region BLBA. The bit line 4260*c* may be electrically connected to the circuit devices 4120*c* providing a page buffer 4293 in the peripheral circuit region PERI in the bit line bonding region BLBA. For example, the bit line 4260*c* may be connected to upper bonding metals 4271*c* and 4272*c* in the peripheral circuit region PERI, and the upper bonding metals 4271*c* and 4272*c* may be connected to lower bonding metals 4171*c* and 4172*c* connected to the circuit devices 4120*c* of the page buffer 4293.

In the word line bonding region WLBA, the word lines 4230 may extend in a second direction (an X-axis direction) parallel to the top surface of the second substrate 4210 and may be connected to a plurality of cell contact plugs 4241 to 4247 (4240). The word lines 4230 and the cell contact plugs 4240 may be connected to one another at pads which are provided by extending at least some of the word lines 4230 by different lengths in the second direction. The first metal layer 4250*b* and the second metal layer 4260*b* may be sequentially connected to upper portions of the cell contact plugs 4240 connected to the word lines 4230. The cell contact plugs 4240 may be connected to the peripheral circuit region PERI through the upper bonding metals 4271*b* and 4272*b* of the cell region CELL and the lower bonding metals 4171*b* and 4172*b* of the peripheral circuit region PERI, in the word line bonding region WLBA.

The cell contact plugs 4240 may be electrically connected to the circuit devices 4120*b* providing a row decoder 4294 in the peripheral circuit region PERI. In an example embodiment, operation voltages of the circuit devices 4120*b* providing the row decoder 4294 may differ from operation voltages of the circuit devices 4120*c* providing the page buffer 4293. For example, the operation voltages of the circuit devices 4120*c* providing the page buffer 4293 may be higher than the operation voltages of the circuit devices 4120*b* providing the row decoder 4294.

A common source line contact plug 4280 may be disposed in an external pad bonding region PA. The common source line contact plug 4280 may include a conductive material such as metal, a metal compound, or polysilicon and may be electrically connected to the common source line 4220. The first metal layer 4250*a* and the second metal layer 4260*a* may be sequentially stacked on the common source line contact plug 4280. For example, a region where the common source line contact plug 4280, the first metal layer 4250*a*, and the second metal layer 4260*a* are disposed may be defined as an external pad bonding region PA.

A plurality of input/output (I/O) pads (for example, first and second I/O pads) 4105 and 4205 may be disposed in the external pad bonding region PA. Referring to FIG. 15, a lower insulation layer 4101 covering a bottom surface of the first substrate 4110 may be formed under the first substrate 4110, and the first I/O pad 4105 may be formed on the lower insulation layer 4101. The first I/O pad 4105 may be connected to, through a first I/O contact plug 4103, at least one of the plurality of circuit devices 4120*a*, 4120*b*, and 4120*c* disposed in the peripheral circuit region PERI and may be separated from the first substrate 4110 by the lower insulation layer 4101. Also, a side insulation layer may be disposed between the first I/O contact plug 4103 and the first substrate 4110 and may electrically disconnect the first I/O contact plug 4103 from the first substrate 4110.

Referring to FIG. 15, an upper insulation layer 4201 covering a top surface of the second substrate 4210 may be formed on the second substrate 4210, and the second I/O pad 4205 may be disposed on the upper insulation layer 4201. The second I/O pad 4205 may be connected to, through a second I/O contact plug 4203, at least one of the plurality of circuit devices 4120*a*, 4120*b*, and 4120*c* disposed in the peripheral circuit region PERI.

According to example embodiments, the second substrate 4210 and the common source line 4220 may not be disposed in a region where the second I/O contact plug 4203 is disposed. Also, the second I/O pad 4205 may not overlap the word lines 4230 in a third direction (a Z-axis direction). Referring to FIG. 15, the second I/O contact plug 4203 may be separated from the second substrate 4210 in a direction parallel to the top surface of the second substrate 4210, and moreover, may pass through the interlayer insulation layer 4215 of the cell region CELL and may be connected to the second I/O pad 4205.

According to example embodiments, the first I/O pad 4105 and the second I/O pad 4205 may be optionally formed. For example, the memory device 4000 may include only the first I/O pad 4105 disposed on the first substrate 4110, or may include only the second I/O pad 4205 disposed on the second substrate 4210. Alternatively, the memory device 4000 may include all of the first I/O pad 4105 and the second I/O pad 4205.

In each of the external pad bonding region PA and the bit line bonding region BLBA included in each of the cell region CELL and the peripheral circuit region PERI, a metal pattern of an uppermost metal layer may be provided as a dummy pattern, or the uppermost metal layer may be empty.

In the memory device 4000, in the external pad bonding region PA, a lower metal pattern 4176*a* having the same shape as that of the upper metal pattern 4272*a* of the cell region CELL may be formed in an uppermost metal layer of the peripheral circuit region PERI, on the basis of the upper metal pattern 4272*a* formed in an uppermost metal layer of the cell region CELL. The lower metal pattern 4176*a* formed in the uppermost metal layer of the peripheral circuit region PERI may not be connected to a separate contact in the peripheral circuit region PERI. Similarly, in the external pad bonding region PA, an upper metal pattern having the same shape as that of a lower metal pattern of the peripheral circuit region PERI may be formed in an uppermost metal layer of the cell region CELL, on the basis of a lower metal pattern formed in an uppermost metal layer of the peripheral circuit region PERI.

The lower bonding metals 4171*b* and 4172*b* may be formed on the second metal layer 4140*b* of the word line bonding region WLBA. In the word line bonding region WLBA, the lower bonding metals 4171*b* and 4172*b* of the peripheral circuit region PERI may be electrically connected to the upper bonding metals 4271*b* and 4272*b* of the cell region CELL by the bonding manner.

Also, in the bit line bonding region BLBA, an upper metal pattern 4292 having the same shape as that of a lower metal pattern 4152 of the peripheral circuit region PERI may be formed in the uppermost metal layer of the cell region CELL, on the basis of a lower metal pattern 4152 formed in the uppermost metal layer of the peripheral circuit region PERI. A contact may not be formed in the upper metal pattern 4292 formed in the uppermost metal layer of the cell region CELL.

At least one of the components, elements, modules or units represented by a block as illustrated in FIGS. 1, 2, 4, 7, 11 and 13 may be embodied as various numbers of hardware, software and/or firmware structures that execute respective functions described above, according to an example embodiment. For example, at least one of these components, elements, modules or units may include transistors, capacitors, logic gates, and other circuit elements to implement functionality described above, or may use a direct circuit structure, such as a memory, a processor, a logic circuit, a look-up table, etc., that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been particularly shown and described, it will be understood that various changes in form and details may be made therein without departing from the spirit and scope of the following claims.

What is claimed is:

1. An operating method of a storage device including a non-volatile memory, the operating method comprising:
   receiving a first source voltage generated by a power management integrated circuit through a first voltage signal pin;
   based on the first source voltage being different from a target voltage of the storage device, controlling the first source voltage to the target voltage while receiving the first source voltage generated by the power management integrated circuit;
   receiving a command, which indicates an information request associated with an operation voltage of the storage device, from a host;
   transmitting a response, which corresponds to the information request, to the host by using the storage device;
   receiving a second source voltage which is generated by the power management integrated circuit and has a voltage level different from the first source voltage, through the first voltage signal pin; and
   providing the second source voltage to the non-volatile memory,
   wherein the receiving the second source voltage comprises:
      generating an internal voltage control signal indicating whether to convert the second source voltage, based on the second source voltage; and
      controlling the second source voltage to the target voltage based on the internal voltage control signal.

2. The operating method of claim 1, wherein the controlling the first source voltage to the target voltage comprises, based on the first source voltage being higher than the target voltage, controlling the first source voltage to the target voltage.

3. The operating method of claim 1, wherein the first source voltage is higher than the operation voltage.

4. The operating method of claim 1, wherein the generating the internal voltage control signal comprises generating the internal voltage control signal based on a comparison of the second source voltage and the target voltage.

5. The operating method of claim 4, wherein the generating the internal voltage control signal comprises:
   based on the second source voltage being lower than or equal to the target voltage, generating a first internal voltage control signal for maintaining the second source voltage; and
   based on the second source voltage being higher than the target voltage, generating a second internal voltage control signal for converting the second source voltage.

6. The operating method of claim 5, wherein the controlling the second source voltage comprises controlling the second source voltage to the target voltage based on the second internal voltage control signal.

7. The operating method of claim 5, wherein the first internal voltage control signal and the second internal voltage control signal have different logic levels.

8. The operating method of claim 1, further comprising receiving a third source voltage through a second voltage signal pin,
   wherein the receiving the second source voltage comprises:
      generating the internal voltage control signal indicating whether to convert the second source voltage based on the second source voltage and the third source voltage; and
      controlling the second source voltage to the target voltage based on the internal voltage control signal.

9. The operating method of claim 1, wherein the second source voltage and the operation voltage have a same voltage level.

10. A storage system comprising:
    a power management integrated circuit configured to generate a source voltage;
    a storage device configured to control a first source voltage to a target voltage of the storage device while the first source voltage is received from the power management integrated circuit; and
    a host configured to receive data associated with an operation voltage of the storage device from the storage device and control the power management integrated circuit to provide the storage device with a second source voltage having a voltage level different from the first source voltage, based on the data,
    wherein the storage device is further configured to generate an internal voltage control signal indicating whether to convert the second source voltage, based on the second source voltage, and convert the second source voltage to the target voltage based on the internal voltage control signal.

* * * * *